United States Patent
Mori

(10) Patent No.: US 10,284,163 B2
(45) Date of Patent: May 7, 2019

(54) FREQUENCY-VARIABLE LC FILTER AND HIGH-FREQUENCY FRONT END CIRCUIT

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/914,493

(22) Filed: Mar. 7, 2018

(65) Prior Publication Data

US 2018/0198433 A1    Jul. 12, 2018

Related U.S. Application Data

(63) Continuation of application No. PCT/JP2016/069222, filed on Jun. 29, 2016.

(30) Foreign Application Priority Data

Sep. 9, 2015 (JP) .................................. 2015-177145
Apr. 4, 2016 (JP) .................................. 2016-075124

(51) Int. Cl.
*H03H 9/64* (2006.01)
*H03H 7/075* (2006.01)
(Continued)

(52) U.S. Cl.
CPC .......... *H03H 7/075* (2013.01); *H03H 7/0115* (2013.01); *H03H 7/09* (2013.01);
(Continued)

(58) Field of Classification Search
CPC ............................. H03H 7/075; H03H 7/0115
See application file for complete search history.

(56) References Cited

U.S. PATENT DOCUMENTS

| 4,584,544 A | 4/1986 | Hettiger |
| 2014/0106698 A1 | 4/2014 | Mi et al. |
| 2014/0285286 A1* | 9/2014 | Bojer .................. H03H 7/0153 333/174 |

(Continued)

FOREIGN PATENT DOCUMENTS

| JP | S61-212106 A | 9/1986 |
| JP | S62-209910 A | 9/1987 |

(Continued)

OTHER PUBLICATIONS

International Search Report for International Application No. PCT/JP2016/069222, dated Sep. 20, 2016.

(Continued)

*Primary Examiner* — Tuan H Nguyen
(74) *Attorney, Agent, or Firm* — Pearne & Gordon LLP

(57) ABSTRACT

A first series arm LC filter circuit includes a capacitor and an inductor connected in series to provide a series circuit between a first connection terminal and a second connection terminal, a capacitor connected in parallel to the series circuit, and an inductor and a variable capacitor connected in parallel between a connection point of the capacitor and the inductor and a ground potential. A first parallel arm LC filter circuit is connected between the first connection terminal and the ground potential. A second parallel arm LC filter circuit is connected between the second connection terminal and the ground potential. The inductor is directly connected to the second connection terminal or is connected to the second connection terminal with another inductor interposed therebetween.

18 Claims, 26 Drawing Sheets

(51) Int. Cl.
*H03H 7/09* (2006.01)
*H03H 7/12* (2006.01)
*H04B 1/52* (2015.01)
*H04B 1/58* (2006.01)
*H03H 7/01* (2006.01)
*H03H 9/60* (2006.01)
*H04B 1/18* (2006.01)

(52) U.S. Cl.
CPC ............ *H03H 7/12* (2013.01); *H03H 7/175* (2013.01); *H03H 7/1708* (2013.01); *H03H 7/1758* (2013.01); *H03H 7/1766* (2013.01); *H03H 7/1775* (2013.01); *H03H 9/605* (2013.01); *H03H 9/6483* (2013.01); *H04B 1/18* (2013.01); *H04B 1/52* (2013.01); *H04B 1/58* (2013.01); *H03H 2210/025* (2013.01)

(56) References Cited

U.S. PATENT DOCUMENTS

2015/0303892 A1\* 10/2015 Desclos ............... H03H 7/1758
333/132
2016/0065165 A1  3/2016 Kadota

FOREIGN PATENT DOCUMENTS

| | | |
|---|---|---|
| JP | 2008-227729 A | 9/2008 |
| WO | 2005/088832 A1 | 9/2005 |
| WO | 2013/005264 A1 | 1/2013 |
| WO | 2014/192754 A1 | 12/2014 |

OTHER PUBLICATIONS

Written Opinion for International Application No. PCT/JP2016/069222, dated Sep. 20, 2016.

\* cited by examiner

FREQUENCY-VARIABLE LC FILTER AND HIGH-FREQUENCY FRONT END CIRCUIT

This is a continuation of International Application No. PCT/JP2016/069222 filed on Jun. 29, 2016 which claims priority from Japanese Patent Application No. 2015-177145 filed on Sep. 9, 2015 and claims priority from Japanese Patent Application No. 2016-075124 filed on Apr. 4, 2016. The contents of these applications are incorporated herein by reference in their entireties.

BACKGROUND

Technical Field

The present disclosure relates to a frequency-variable LC filter including a resonance circuit of an inductor and a variable capacitor.

Patent Document 1 discloses a frequency-variable LC filter using an inductor and a variable capacitor. The frequency-variable LC filter in Patent Document 1 includes a first LC parallel circuit, a second LC parallel circuit, a third series circuit, and a fourth series circuit. Both of the first LC parallel circuit and the second LC parallel circuit include parallel circuits of inductors and variable capacitors. One ends of the first LC parallel circuit and the second LC parallel circuit are connected to each other with a coupling inductor and the other ends thereof are connected to a ground potential.

The third series circuit includes a variable capacitor, and one end thereof is connected to the first LC parallel circuit and the other end thereof is connected to a first connection terminal. The fourth series circuit includes a variable capacitor, and one end thereof is connected to the second LC parallel circuit and the other end thereof is connected to a second connection terminal.

The one end (end portion at the side at which the coupling inductor is connected) of the first LC parallel circuit is connected to the first connection terminal with a first variable capacitor interposed therebetween. The one end (end portion at the side at which the coupling inductor is connected) of the second LC parallel circuit is connected to the second connection terminal with a second variable capacitor interposed therebetween. The first connection terminal and the second connection terminal are connected with a fixed capacitor interposed therebetween.

With this configuration, capacitances of the variable capacitors of the first and second parallel circuits and capacitances of the variable capacitors of the third and fourth series circuits are changed to adjust bandpass characteristics.

Patent Document 1: International Publication No. 2005/088832

BRIEF SUMMARY

However, the frequency-variable LC filter disclosed in Patent Document 1 uses four variable capacitors to adjust the characteristics, resulting in increase in a circuit size.

Furthermore, the frequency-variable LC filter disclosed in Patent Document 1 has the configuration in which two variable capacitors ("54 and 55" in Patent Document 1) are connected in series between the first connection terminal as an input terminal and the second connection terminal as an output terminal, resulting in increase in loss of bandpass characteristics.

Moreover, the frequency-variable LC filter disclosed in Patent Document 1 has a large difference between steepness of attenuation characteristics at the low frequency side of a pass band and steepness of the attenuation characteristics at the high frequency side thereof.

Accordingly, the present disclosure provides a frequency-variable LC filter having a simple configuration capable of providing steep attenuation characteristics at both sides of a pass band with low loss of bandpass characteristics.

A frequency-variable LC filter according to an aspect of the disclosure includes an input terminal, an output terminal, a first series arm LC filter circuit, and first and second parallel arm LC filter circuits. The first series arm LC filter circuit is connected between the input terminal and the output terminal. The first parallel arm LC filter circuit is a circuit both ends of which are one end of the first series arm LC filter circuit and a ground potential. The second parallel arm LC filter circuit is a circuit both ends of which are the other end of the first series arm LC filter circuit and the ground potential. Each of the first parallel arm LC filter circuit and the second parallel arm LC filter circuit includes a variable capacitor and an inductor connected in series. The first series arm LC filter circuit includes a fixed capacitor, an LC series circuit, and an LC parallel circuit. The fixed capacitor is connected in parallel to the LC series circuit. Both ends of the LC series circuit are the input terminal and the output terminal and the LC series circuit includes a fixed capacitor and an inductor connected in series. The LC parallel circuit includes a variable capacitor and an inductor connected in parallel. The inductor included in the LC series circuit is directly connected to the output terminal or is connected to the output terminal with another inductor interposed therebetween.

With this configuration, no variable capacitor is connected in series between the input terminal and the output terminal. Furthermore, three variable capacitors are provided. Therefore, the circuit configuration is simplified while suppressing loss of bandpass characteristics.

In the frequency-variable LC filter in the aspect of the disclosure, a resonant frequency of the first parallel arm LC filter circuit can be lower than a center frequency of a pass band of the frequency-variable filter and a resonant frequency of the second parallel arm LC filter circuit can be higher than the center frequency.

With this configuration, steepness of attenuation characteristics is improved at both sides of the pass band and a frequency range providing desired attenuation is enlarged.

The frequency-variable LC filter in the aspect of the disclosure can have the following configuration. A resonant frequency of the LC parallel circuit in the first series arm LC filter circuit is higher than the resonant frequency of the first parallel arm LC filter circuit and is lower than the center frequency. A resonant frequency of the LC series circuit in the first series arm LC filter circuit and a resonant frequency by the inductor and the fixed capacitor of the LC series circuit are higher than the center frequency and are lower than the resonant frequency of the second parallel arm LC filter circuit.

With this configuration, the steepness of the attenuation characteristics is further improved at both sides of the pass band and the frequency range providing the desired attenuation is further enlarged.

Furthermore, the frequency-variable LC filter in the aspect of the disclosure can have the following configuration. Inductances of the inductor of the LC series circuit, the inductor of the LC parallel circuit, and the inductor of the first parallel arm LC filter circuit are larger than 20 nH. Capacitances of the variable capacitor of the first parallel arm LC filter circuit and the variable capacitor of the second parallel arm LC filter circuit are smaller than 20 pF.

With this configuration, the steepness of the attenuation characteristics is further improved at both sides of the pass band and the frequency range providing the desired attenuation is further enlarged.

In the frequency-variable LC filter in the aspect of the disclosure, a capacitance of the variable capacitor of the first series arm LC filter circuit can be smaller than 20 pF.

With this configuration, the steepness of the attenuation characteristics is improved at both sides of the pass band and the frequency range providing the desired attenuation is enlarged.

Moreover, in the frequency-variable LC filter in the aspect of the disclosure, at least one inductor of the inductor of the first parallel arm LC filter circuit, the inductor of the LC series circuit, the inductor of the LC parallel circuit, and the inductor of the second parallel arm LC filter circuit can be magnetically coupled with another inductor differing from the at least one inductor among the above-described inductors.

With this configuration, the steepness of the attenuation characteristics is improved.

Furthermore, in the frequency-variable LC filter in the aspect of the disclosure, the inductor of the first parallel arm LC filter circuit can be capacitively coupled with at least one of the inductor of the LC series circuit, the inductor of the LC parallel circuit, and the inductor of the second parallel arm LC filter circuit.

With this configuration, the capacitance of the fixed capacitor can be decreased or the fixed capacitor can be omitted, thereby further reducing the frequency-variable LC filter in size.

The frequency-variable LC filter in the aspect of the disclosure further can include a fixed capacitor connected between the first series arm LC filter circuit and the input terminal, an LC series circuit connected between a connection point of the fixed capacitor and the input terminal and the ground potential, and a fixed capacitor one end of which is connected to the output terminal and the other end of which is connected to the ground potential. The second parallel arm LC filter circuit includes an inductor connected in parallel to the variable capacitor and the inductor connected in series.

With this configuration, not only the steepness of the attenuation characteristics is improved at both sides of the pass band but also the attenuation of a harmonic and moreover the attenuation at the lower frequency side are increased.

The frequency-variable LC filter in the aspect of the disclosure can further include two fixed capacitors connected in series between the first series arm LC filter circuit and the input terminal, and an inductor and a fixed capacitor connected in parallel between the first series arm LC filter circuit and the output terminal. The second parallel arm LC filter circuit includes an inductor connected in parallel to the variable capacitor and the inductor connected in series, and the first parallel arm LC filter circuit is connected between a path between the two fixed capacitors and the ground potential.

With this configuration, the bandpass characteristics are further improved while maintaining the attenuation characteristics.

Furthermore, the frequency-variable LC filter in the aspect of the disclosure can be set as follows. A center frequency f0 of a pass band, which is defined by the first series arm LC filter circuit, a frequency fp2 of an attenuation pole, which is defined by the first series arm LC filter circuit and is higher than the pass band, a frequency fp1 of an attenuation pole, which is defined by the first parallel arm LC filter circuit and is lower than the pass band, and a frequency fp3 of an attenuation pole, which is defined by the second parallel arm LC filter circuit and is higher than the frequency fp2, satisfy the following three equations.

$$f0/2 < fp1 < f0 \qquad \text{Equation 1}$$

$$f0 < fp2 < 3 \times f0/2 \qquad \text{Equation 2}$$

$$2 \times f0 < fp3 < 3 \times f0 \qquad \text{Equation 3}$$

For example, capacitances of the respective variable capacitors are set so as to satisfy the above-described equations 1 to 3. Satisfaction of these three equations enables the frequency-variable LC filter to maintain the desired bandpass characteristics and maintain the desired attenuations at around the attenuation poles at both sides of the pass band and at around a frequency of the harmonic even when the pass band is changed.

Furthermore, another aspect of the disclosure relates to a high-frequency front end circuit and has the following features. The high-frequency front end circuit performs wireless communication by selecting a usage channel from vacant communication channels of a plurality of communication channels in a communication band that is configured by the plurality of communication channels in a specific frequency band that is used in the system. The high-frequency front end circuit includes a fixed filter and first and second variable filters. The fixed filter attenuates high-frequency signals outside the specific frequency band that is used in the system. The first variable filter attenuates high-frequency signals of unnecessary waves in the specific frequency band, which vary depending on the usage channel. The second variable filter is configured by a frequency-variable LC filter and attenuates IMD (intermodulation distortion) in the specific frequency band. The second variable filter is the frequency-variable LC filter according to any one of the above-described filters.

This configuration improves insertion loss of the second variable filter and makes attenuation characteristics steep. Transmission characteristics as the high-frequency front end circuit are therefore improved.

Furthermore, the high-frequency front end circuit in the aspect of the disclosure can have the following configuration. The first variable filter includes an input terminal, an output terminal, a series arm resonance circuit, and first and second parallel arm resonance circuits. The series arm resonance circuit is connected in series between the input terminal and the output terminal. The first parallel arm resonance circuit is a circuit both ends of which are one end of the series arm resonance circuit and a ground potential. The second parallel arm resonance circuit is a circuit both ends of which are the other end of the series arm resonance circuit and the ground potential. The series arm resonance circuit includes a fixed capacitor having a fixed capacitance. Each of the series arm resonance circuit, the first parallel arm resonance circuit, and the second parallel arm resonance circuit includes a variable capacitor, an inductor, and an elastic wave resonator. The variable capacitor, the inductor, and the elastic wave resonator in the series arm resonance circuit are connected in parallel. The variable capacitor, the inductor, and the elastic wave resonator in each of the first parallel arm resonance circuit and the second parallel arm resonance circuit are connected in series. The fixed capacitor in the series arm resonance circuit is connected to the parallel arm resonance including the elastic wave resonator having a lower impedance of an impedance of the elastic wave resonator of the first parallel arm resonance circuit and an impedance of the elastic wave resonator of the second parallel arm resonance circuit.

This configuration makes the attenuation characteristics at both sides of the pass band of the first variable filter steep. The transmission characteristics as the high-frequency front end circuit are therefore improved.

Furthermore, the high-frequency front end circuit in the aspect of the disclosure can include a detector detecting respective reception levels of a plurality of vacant communication channels when there is the plurality of vacant communication channels, and a determination unit selecting, as the usage channel, a vacant communication channel having the highest reception level among the plurality of detected reception levels.

With this configuration, high-frequency signals can be transmitted and received using an optimum communication channel. The transmission characteristics of the high-frequency front end circuit can therefore be further improved.

Furthermore, the high-frequency front end circuit in the aspect of the disclosure can further include an amplification-side amplification circuit.

Furthermore, the high-frequency front end circuit in the aspect of the disclosure can further include a signal processor.

The present disclosure can provide a frequency-variable LC filter capable of decreasing loss of bandpass characteristics and decreasing a difference between steepness of attenuation characteristics at the low frequency side of a pass band and steepness of the attenuation characteristics at the high frequency side thereof with a simple configuration reduced in size.

DETAILED DESCRIPTION

Figure 1:
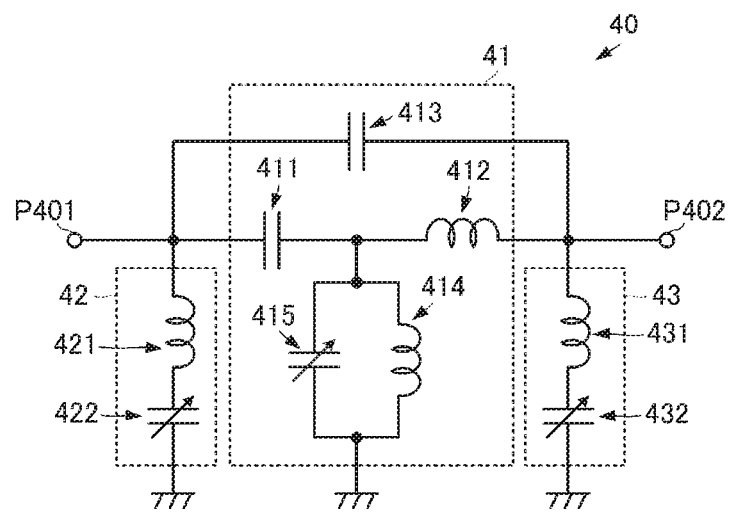
FIG. 1 is a circuit diagram of a frequency-variable LC filter according to a first embodiment of the present disclosure.

A frequency-variable LC filter according to a first embodiment of the present disclosure will be described with reference to the drawings. FIG. 1 is a circuit diagram of the frequency-variable LC filter in the first embodiment of the present disclosure.

A frequency-variable LC filter 40 includes a first series arm LC filter circuit 41, a first parallel arm LC filter circuit 42, a second parallel arm LC filter circuit 43, a first connection terminal P401, and a second connection terminal P402.

The first series arm LC filter circuit 41 is connected between the first connection terminal P401 as an input terminal and the second connection terminal P402 as an output terminal. The first parallel arm LC filter circuit 42 is connected between the first series arm LC filter circuit 41 at the first connection terminal P401 side and a ground potential. The second parallel arm LC filter circuit 43 is connected between the first series arm LC filter circuit 41 at the second connection terminal P402 side and the ground potential.

The first series arm LC filter circuit 41 includes capacitors 411 and 413, inductors 412 and 414, and a variable capacitor 415.

The capacitor 411 and the inductor 412 are connected in series between the first connection terminal P401 and the second connection terminal P402. In this case, the inductor 412 is connected directly in series to the second connection terminal P402. The capacitor 413 is connected in parallel to a series circuit of the capacitor 411 and the inductor 412. The inductor 414 and the variable capacitor 415 are connected in parallel. This parallel circuit is connected between a connection point between the capacitor 411 and the inductor 412 and the ground potential.

A resonant frequency f41 of the first series arm LC filter circuit 41 formed by the above-described circuit configuration mainly contributes to a frequency of a pass band of the frequency-variable LC filter 40 and a frequency of an attenuation pole at the high frequency side of the pass band.

In this case, when a center frequency of the pass band is f0, a resonant frequency f412 of the parallel circuit of the inductor 414 and the variable capacitor 415 is set to be lower than the center frequency f0 (f412<f0). A resonant frequency f411 of the parallel circuit of the inductor 412 and the capacitor 413 is set to be higher than the center frequency f0 (f411>f0). Furthermore, a resonant frequency f413 of the series circuit of the capacitor 411 and the inductor 412 is set to be higher than the center frequency f0 (f413>f0).

The first parallel arm LC filter circuit 42 includes an inductor 421 and a variable capacitor 422.

A series circuit of the inductor 421 and the variable capacitor 422 is connected between the first series arm LC filter circuit 41 at the first connection terminal P401 side and the ground potential.

A resonant frequency f42 of the first parallel arm LC filter circuit 42 formed by the above-described circuit configuration mainly contributes to a frequency of an attenuation pole at the low frequency side of the pass band of the frequency-variable LC filter 40. In this case, the resonant frequency f42 is set to be lower than the center frequency f0 (f42<f0). To be more specific, the resonant frequency f42 is set to be lower than the resonant frequency f412 (f42<f412).

The second parallel arm LC filter circuit 43 includes an inductor 431 and a variable capacitor 432.

A series circuit of the inductor 431 and the variable capacitor 432 is connected between the first series arm LC filter circuit 41 at the second connection terminal P402 side and the ground potential.

A resonant frequency f43 of the second parallel arm LC filter circuit 43 formed by the above-described circuit configuration mainly contributes to a frequency of an attenuation pole at the high frequency side of the pass band of the frequency-variable LC filter 40. In this case, the resonant frequency f43 is set to be higher than the center frequency f0 (f43>f0). To be more specific, the resonant frequency f43 is set to be higher than the resonant frequencies f411 and f413 (f42>f411, f413).

The above-described configuration can realize a band pass filter having the pass band and the attenuation poles frequencies which are changeable by changing the capacitances of the variable capacitors 415, 422, and 432.

Figure 2:
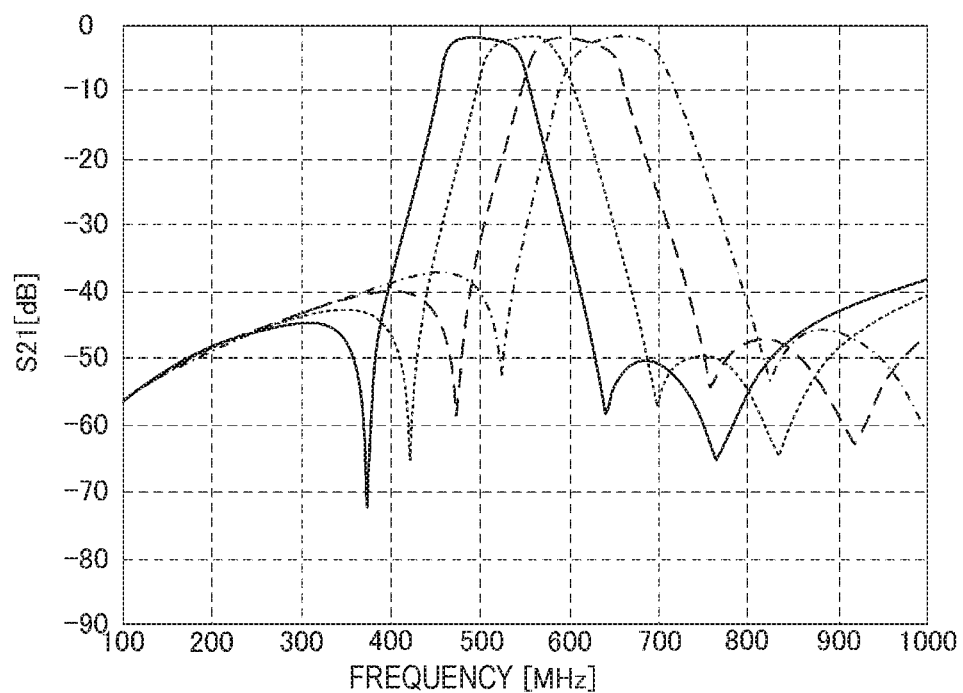
FIG. 2 is a graph illustrating bandpass characteristics of the frequency-variable LC filter in the first embodiment of the present disclosure.

FIG. 2 is a graph illustrating bandpass characteristics of the frequency-variable LC filter in the first embodiment of the present disclosure. As illustrated in FIG. 2, usage of the frequency-variable LC filter 40 can form the attenuation poles at both sides of the pass band with a pass band width of approximately 100 [MHz]. Furthermore, the attenuation can be made difficult to be decreased in frequency bands at the opposite sides to the pass band with respect to the respective attenuation poles and desired attenuation can be realized in a wide frequency band. In addition, the attenuation can be increased at both of the high frequency side and the low frequency side of the pass band and the frequency band in which the desired attenuation is provided can be enlarged.

In particular, as illustrated in FIG. 1, the inductor 412 of the first series arm LC filter circuit 41 is directly connected to the second connection terminal P402 without necessarily the capacitor interposed therebetween, thereby making attenuation characteristics steep.

Figure 3:
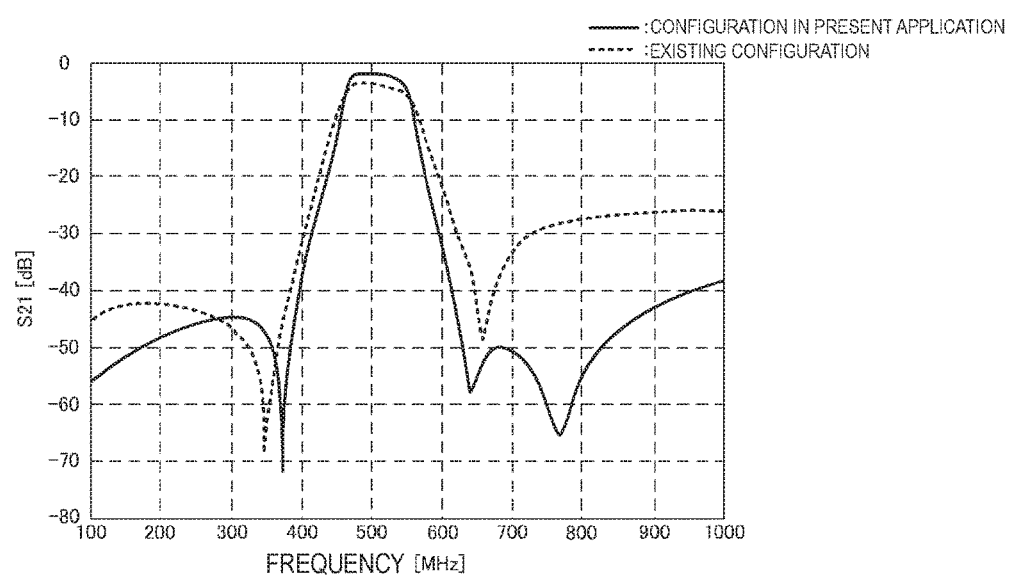
FIG. 3 is a graph illustrating bandpass characteristics of the frequency-variable LC filter in the first embodiment of the present disclosure and an existing configuration.

In other words, the attenuation characteristics can be made steeper as illustrated in FIG. 3 by connecting the inductor 412 of the first series arm LC filter circuit 41 directly to the second connection terminal P402 or connecting it to the second connection terminal P402 with another inductor interposed therebetween.

This effect is considered to be provided for the following reason.

The capacitor that is directly connected to the inductor has frequency characteristics of attenuating low frequency and allowing high frequency to pass like a high pass filter, and therefore causes deterioration in attenuation of the high frequency.

On the other hand, the inductor that is directly connected to the connection terminal has frequency characteristics of attenuating the high frequency and allowing the low frequency to pass like a low pass filter.

FIG. 3 is a graph illustrating bandpass characteristics of the frequency-variable LC filter in the first embodiment of the present disclosure and an existing configuration. The existing configuration illustrated in FIG. 3 is the circuit configuration described in the background art, that is, the configuration in which the variable capacitors are connected to the respective connection terminals and the inductors are connected between the variable capacitors. Although FIG. 3 illustrates setting of only one type of capacitances of the variable capacitors, the same result can be provided for other capacitances.

As illustrated in FIG. 3, usage of the frequency-variable LC filter 40 in the present application can decrease loss in the pass band and can make the attenuation characteristics at both sides (high frequency side and low frequency side) of the pass band steep.

As described above, usage of the configuration in the embodiment can decrease the loss of the bandpass characteristics and decrease the difference between the steepness of the attenuation characteristics at the low frequency side of the pass band and the steepness of the attenuation characteristics at the high frequency side thereof. Moreover, this configuration can reduce the number of variable capacitors configuring the circuit and realize the frequency-variable LC filter with a simple configuration.

The inductances of the inductors 412, 414, and 421 can be larger than 20 [nH]. The attenuation characteristics can be further improved by using the inductors having the above-described inductances.

Furthermore, the capacitances of the variable capacitors 422 and 432 can be smaller than 20 [pF]. The capacitance of the variable capacitor 415 can be smaller than 20 [pF]. The attenuation characteristics can be further improved by adjusting the capacitances of the variable capacitors in the above-described capacitance range.

Figure 4A:
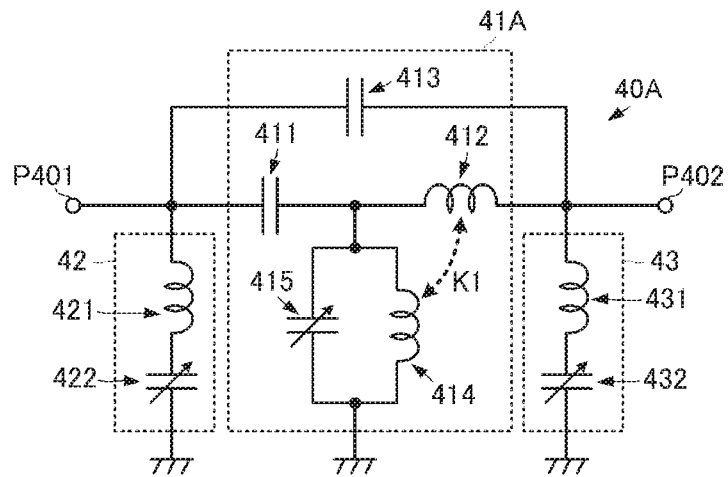
FIGS. 4A, 4B, and 4C are circuit diagrams of frequency-variable LC filters according to a second embodiment of the present disclosure.
Figure 4B:
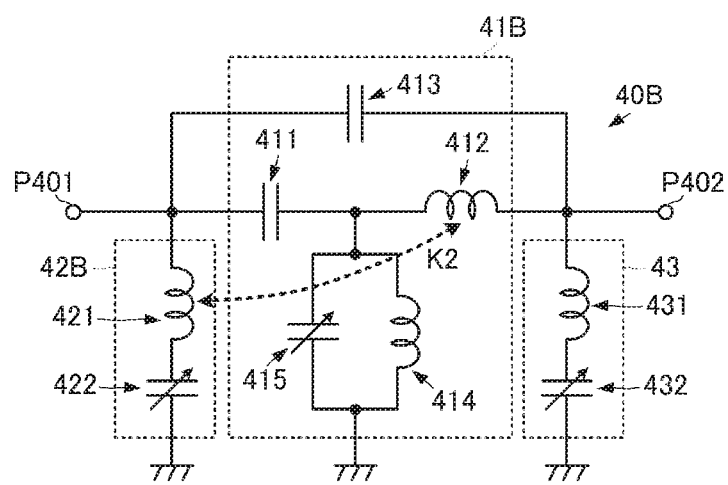
Figure 4C:
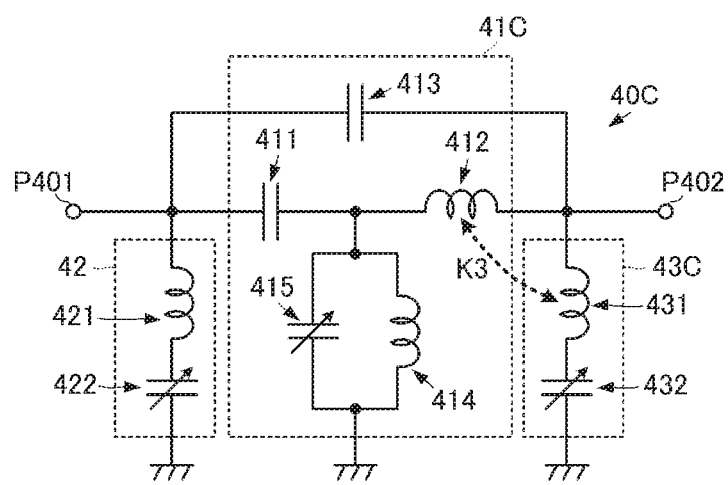

Next, frequency-variable LC filters according to a second embodiment of the present disclosure will be described with reference to the drawings. FIGS. 4A, 4B, and 4C are circuit diagrams of the frequency-variable LC filters in the second embodiment of the present disclosure. FIGS. 4A, 4B, and 4C illustrate modes in which places of magnetic field coupling are different from one another.

Frequency-variable LC filters 40A, 40B, and 40C in the embodiment are different from the frequency-variable LC filter 40 in the first embodiment in a point that inductors are magnetically coupled. Other configurations thereof are the same as those of the frequency-variable LC filter 40 in the first embodiment.

As illustrated in FIG. 4A, the inductor 412 and the inductor 414 are magnetically coupled with each other in the frequency-variable LC filter 40A. As illustrated in FIG. 4B, the inductor 412 and the inductor 421 are magnetically coupled with each other in the frequency-variable LC filter 40B. As illustrated in FIG. 4C, the inductor 412 and the inductor 431 are magnetically coupled with each other in the frequency-variable LC filter 40C.

Figure 5:
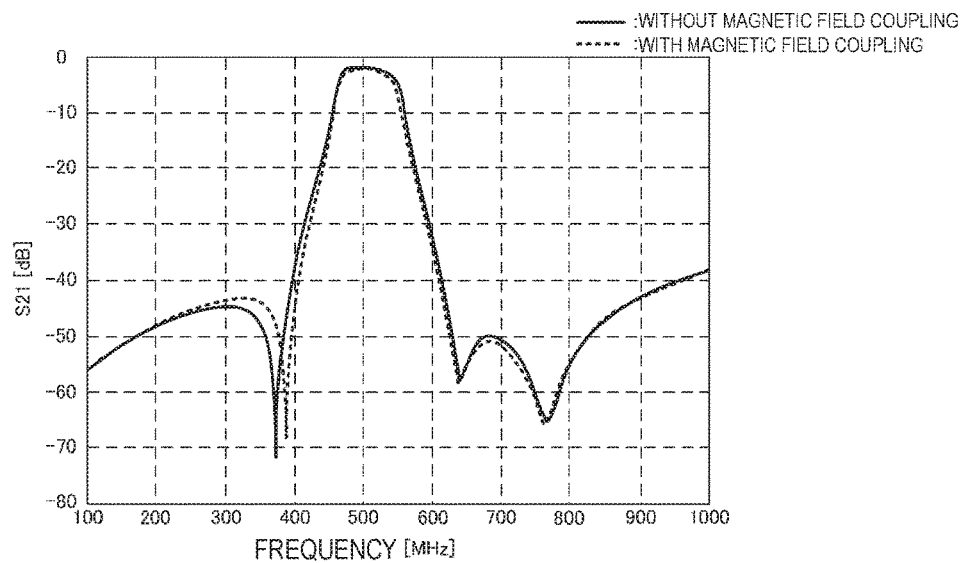
FIG. 5 is a graph illustrating bandpass characteristics of the frequency-variable LC filter in the second embodiment of the present disclosure.

The bandpass characteristics as illustrated in FIG. 5 are provided by causing the inductor 412 that is directly connected to the second connection terminal P402 to be magnetically coupled with another inductor as described above. FIG. 5 is a graph illustrating the bandpass characteristics of the frequency-variable LC filter in the second embodiment of the present disclosure. As illustrated in FIG. 5, usage of the configuration of the frequency-variable LC filter 40A, 40B, or 40C can make the attenuation characteristics steeper while maintaining low loss in the pass band in comparison with a mode that is not magnetically coupled.

The inductor 412 is caused to be magnetically coupled with another inductor in the embodiment. However, inductors that are caused to be magnetically coupled with each other among the inductor in the first parallel arm LC filter circuit, the inductor in the LC series circuit, the inductor in the LC parallel circuit, and the inductor in the second parallel arm LC filter circuit may be combined in a desirable pattern.

Figure 6A:
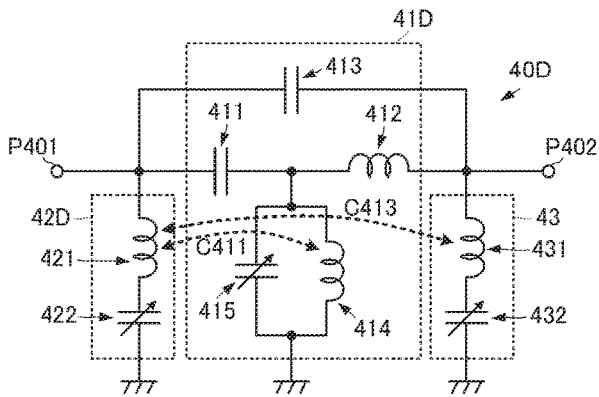
FIGS. 6A and 6B are circuit diagrams of frequency-variable LC filters according to a third embodiment of the present disclosure.
Figure 6B:
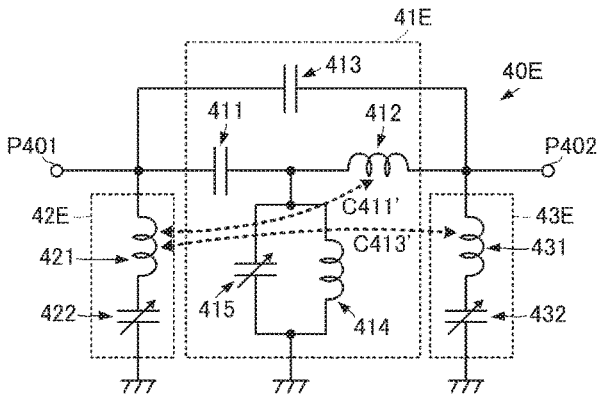

Next, frequency-variable LC filters according to a third embodiment of the present disclosure will be described with reference to the drawings. FIGS. 6A and 6B are circuit diagrams of the frequency-variable LC filters in the third embodiment of the present disclosure. FIGS. 6A and 6B illustrate modes in which places of capacitive coupling are different from each other.

Frequency-variable LC filters 40D and 40E in the embodiment are different from the frequency-variable LC filter 40 in the first embodiment in a point that inductors are caused to be capacitively coupled with each other. Other configurations thereof are the same as those in the frequency-variable LC filter 40 in the first embodiment.

As illustrated in FIG. 6A, the inductor 421 and the inductor 431 are capacitively coupled with each other in the frequency-variable LC filter 40D. With this configuration, at least a part of the capacitance of the capacitor 413 can be provided by the capacitive coupling between the inductor 421 and the inductor 431. Accordingly, the capacitance of the capacitor 413 can be decreased. Alternatively, the capacitor 413 can be omitted.

As illustrated in FIG. 6B, the inductor 421 and the inductor 412 are capacitively coupled with each other in the frequency-variable LC filter 40E. With this configuration, at least a part of the capacitance of the capacitor 411 can be provided by the capacitive coupling between the inductor 421 and the inductor 412. Accordingly, the capacitance of the capacitor 411 can be decreased. Alternatively, the capacitor 411 can be omitted.

With this configuration in the embodiment, the capacitance of the fixed capacitor configuring the frequency-variable LC filter can be decreased or the fixed capacitor can be omitted, thereby reducing the frequency-variable LC filter in size.

Figure 7:
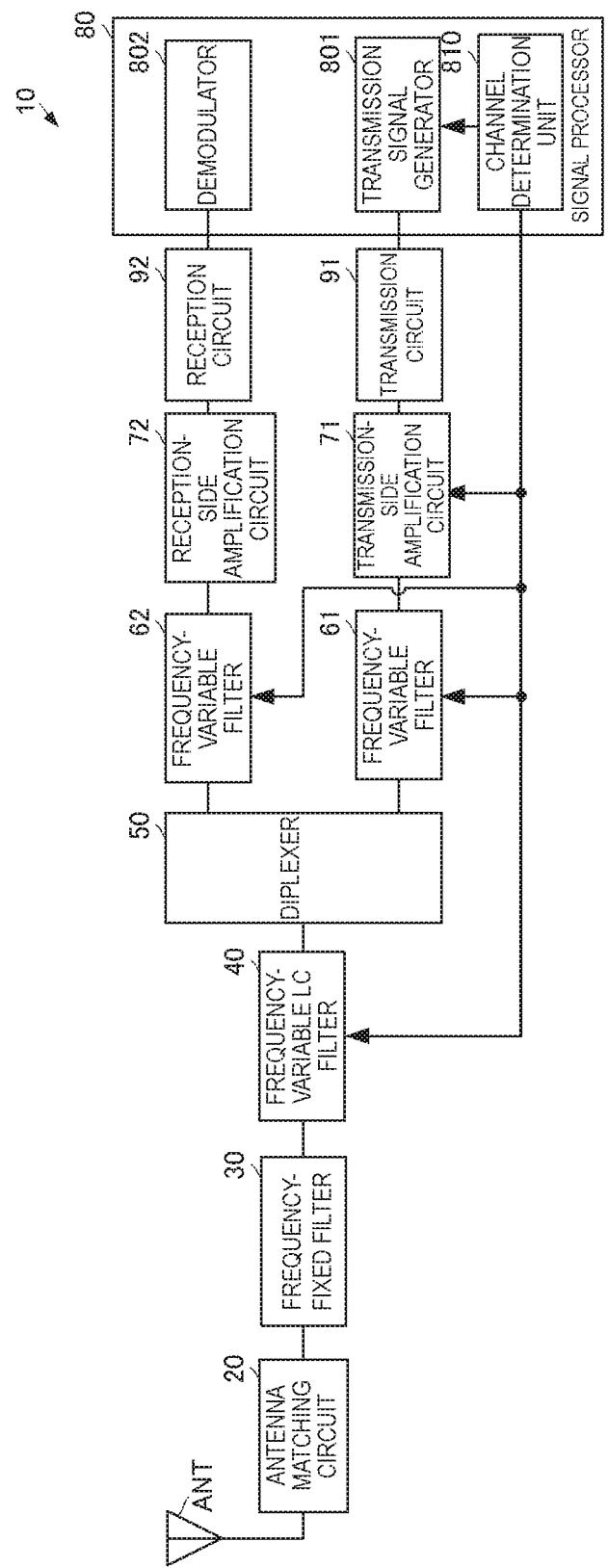
FIG. 7 is a functional block diagram of a high-frequency front end circuit according to an embodiment of the present disclosure.

The frequency-variable LC filter in each of the above-described embodiments can be used in a high-frequency front end circuit, which will be described as follows. FIG. 7 is a functional block diagram of a high-frequency front end circuit according to an embodiment of the present disclosure.

A high-frequency front end circuit 10 includes an antenna ANT, an antenna matching circuit 20, a frequency-fixed filter 30, the frequency-variable LC filter 40, a diplexer 50, frequency-variable filters 61 and 62, a transmission-side amplification circuit 71, a reception-side amplification circuit 72, a signal processor 80, a transmission circuit 91, and a reception circuit 92. The signal processor 80 includes a transmission signal generator 801, a demodulator 802, and a channel determination unit 810. The frequency-fixed filter 30 corresponds to a "fixed filter" in the present disclosure. The frequency-variable LC filter 40 corresponds to a "second filter" in the present disclosure. The frequency-variable filters 61 and 62 correspond to a "first filter" in the present disclosure. It is sufficient that the high-frequency front end circuit 10 includes at least the frequency-fixed filter 30, the frequency-variable LC filter 40, and the frequency-variable filter 61. In this case, the frequency-fixed filter 30, the frequency-variable LC filter 40, and the frequency-variable filter 61 are connected in series in this order. Some or all components of the diplexer 50, the frequency-variable filter 62, the transmission-side amplification circuit 71, the reception-side amplification circuit 72, and the signal processor 80 can be omitted.

The antenna ANT is connected to the antenna matching circuit 20. The antenna matching circuit 20 is connected to the frequency-fixed filter 30. The frequency-fixed filter 30 is connected to the frequency-variable LC filter 40. The frequency-variable LC filter 40 is connected to an antenna-side terminal of the diplexer 50. A transmission-side terminal of the diplexer 50 is connected to the frequency-variable filter 61. The frequency-variable filter 61 is connected to the transmission-side amplification circuit 71. The transmission-side amplification circuit 71 is connected to the transmission circuit 91. The transmission circuit 91 is connected to the transmission signal generator 801 of the signal processor 80. The reception-side terminal of the diplexer 50 is connected to the frequency-variable filter 62. The frequency-variable filter 62 is connected to the reception-side amplification circuit 72. The reception-side amplification circuit 72 is connected to the reception circuit 92. The reception circuit 92 is connected to the demodulator 802 of the signal processor 80.

The high-frequency front end circuit 10 transmits and receives high-frequency signals using a vacant communication channel in a communication band configured by a plurality of communication channels. For example, the high-frequency front end circuit 10 transmits and receives the high-frequency signals in accordance with specifications of a TV white space. With the specifications of the TV white space, channels through which no signal of television broadcasting is transmitted among the plurality of communication channels set to a UHF (ultra high frequency) band of the television broadcasting, that is, a communication band of 470 [MHz] to 790 [MHz] and having frequency band widths of 6 [MHz] are used as vacant communication channels.

Figure 8:
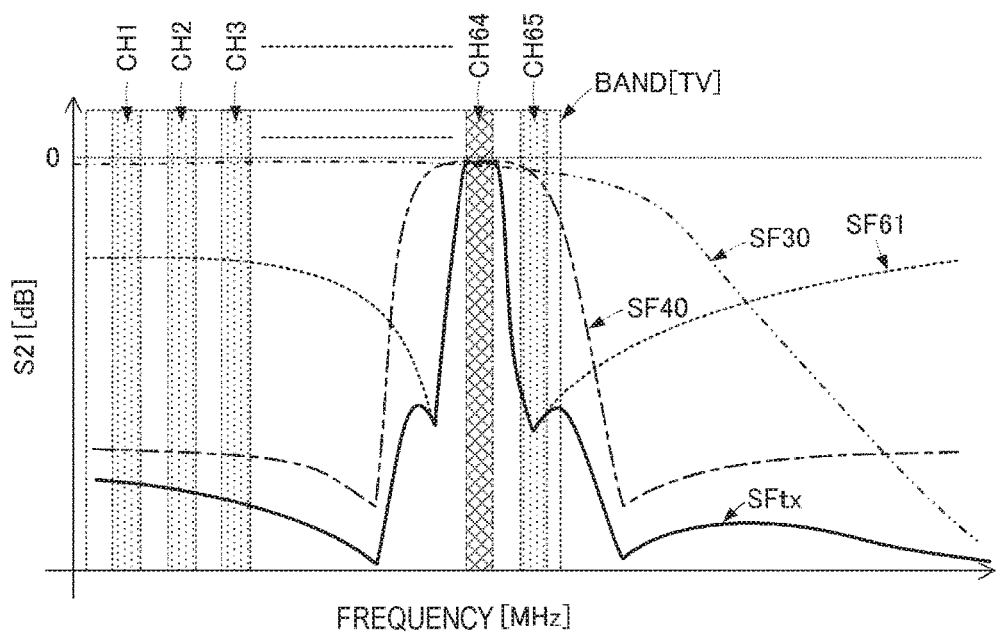
FIG. 8 is a graph illustrating bandpass characteristics of the high-frequency front end circuit in the embodiment of the present disclosure.

FIG. 8 is a graph illustrating bandpass characteristics of the high-frequency front end circuit in the embodiment of the present disclosure. FIG. 8 illustrates relations between the communication band and the respective communication channels. It should be noted that FIG. 8 illustrates the case in which a communication channel CH64 is a selected channel (vacant communication channel that is used for communication in the high-frequency front end circuit 10).

The antenna matching circuit 20 performs impedance matching between the antenna ANT and a circuit at the signal processor 80 side from the frequency-fixed filter 30. The antenna matching circuit 20 is configured by an inductor and a capacitor. For example, in the antenna matching circuit 20, element values of the inductor and the capacitor are set such that return loss of the antenna ANT is equal to or lower than a predetermined value in the communication band overall.

The frequency-fixed filter 30 is configured by an inductor and a capacitor. That is to say, the frequency-fixed filter 30 is a frequency-fixed-type LC filter. In the frequency-fixed filter 30, element values of the inductor and the capacitor are set such that a frequency band of the communication band is within a pass band thereof and frequency bands outside the communication band are within attenuation bands thereof. For example, the frequency-fixed filter 30 is configured by a low pass filter. As indicated by filter characteristics SF30 in FIG. 8, the frequency-fixed filter 30 is configured such that the frequency band of the communication band is within the pass band thereof and the frequency band which is higher than the frequency band of the communication band is within the attenuation band thereof. The frequency-fixed filter 30 therefore transmits high-frequency signals in the communication band with low loss and attenuates high-frequency signals outside the communication band.

As the frequency-variable LC filter 40, any one of the frequency-variable LC filters in FIG. 1, FIGS. 4A, 4B, and 4C, and FIGS. 6A and 6B in the above-described embodiments is employed.

The frequency-variable LC filter 40 changes the pass band and the attenuation band thereof in accordance with the selected channel. In this case, the pass band contains the frequency band of the selected channel. As indicated by filter characteristics SF40 in FIG. 8, the frequency band width of the pass band of the frequency-variable LC filter 40 is larger than the frequency band width of the selected channel. For example, the frequency band width of the pass band of the frequency-variable LC filter 40 is approximately 10 times as large as the frequency band width of the selected channel.

The frequency-variable LC filter 40 has the attenuation poles at both sides of the pass band on a frequency axis. As indicated by the filter characteristics SF40 in FIG. 8, the attenuation band of the frequency-variable LC filter 40 contains no frequency band in which the attenuation is largely decreased and a predetermined attenuation can be provided at all of the frequencies in the communication band outside the pass band.

The frequency-variable LC filter 40 therefore transmits high-frequency signals in the frequency band for a plurality of channels including the selected channel with low loss and attenuates high-frequency signals in the other frequency bands. Accordingly, the frequency-variable LC filter 40 can attenuate unnecessary waves present at frequencies separated from the frequencies for the selected channel in the communication band. In particular, the frequency-variable LC filter 40 can enlarge a frequency range of the attenuation band in comparison with the frequency-variable filters 61 and 62 using resonators, which will be described later. Therefore, the frequency-variable LC filter 40 is effective for attenuation of IMD that can be generated in a large frequency band in the communication band, and that varies in accordance with the usage communication channel (selected channel).

The diplexer 50 is configured by a circulator, a duplexer, or the like. The diplexer 50 outputs transmission signals (high-frequency signals) input from the transmission-side terminal to the antenna-side terminal and outputs reception signals (high-frequency signals) input from the antenna-side terminal to the reception-side terminal.

Each of the frequency-variable filters 61 and 62 includes at least an elastic wave resonator and a variable capacitor. The elastic wave resonator is a resonator using elastic waves, which is used in SAW (surface acoustic waves), BAW (bulk acoustic waves), and the like. Furthermore, each of the frequency-variable filters 61 and 62 includes at least one of an inductor and a capacitor in accordance with filter characteristics. That is to say, each of the frequency-variable filters 61 and 62 is a frequency-variable-type resonator filter. Each of the frequency-variable filters 61 and 62 is a band pass filter using a resonance point and an anti-resonance point of the resonator. The specific circuit configurations of the frequency-variable filters 61 and 62 will be described later. The frequency-variable filters 61 and 62 have the same basic configuration and the frequency-variable filter 61 is therefore described below.

The frequency-variable filter 61 changes a pass band and an attenuation band thereof in accordance with the selected channel. In this case, the pass band contains the frequency band of the selected channel. As indicated by filter characteristics SF61 in FIG. 8, the frequency band width of the pass band of the frequency-variable filter 61 is substantially the same as the frequency band width of the selected channel.

The frequency-variable filter 61 has attenuation poles at both sides of the pass band on the frequency axis. The frequency-variable filter 61 is the resonator filter and the attenuation characteristics of the pass band are steeper than those of the LC filter, as indicated by the filter characteristics SF61 in FIG. 8. The frequency-variable filter 61 therefore transmits high-frequency signals of the selected channel with low loss and attenuates high-frequency signals of adjacent communication channels.

As indicated by the filter characteristics SF61 in FIG. 8, the attenuation band of the frequency-variable filter 61 has frequency bands in which the attenuation is decreased at the opposite sides to the pass band with respect to the attenuation poles. However, the sufficient attenuation can be provided with the frequency-variable LC filter 40 and the frequency-fixed filter 30 even in the frequency bands in which the attenuation cannot be provided with the frequency-variable filter 61 because the frequency-variable filter 61, the frequency-variable LC filter 40, and the frequency-fixed filter 30 are connected in series in a transmission path of the high-frequency signals.

Therefore, the high-frequency signals of the selected channel can be transmitted with low loss and the high-frequency signals in frequency bands other than the selected channel, which include the adjacent channels, can be attenuated as indicated by total filter characteristics SFtx in FIG. 8. The same action effects can be provided even when the selected channel is switched.

The transmission-side amplification circuit 71 includes an amplification element. The specific circuit configuration of the transmission-side amplification circuit 71 will be described later. The transmission-side amplification circuit 71 amplifies a transmission signal generated by the transmission signal generator 801 and outputs it to the frequency-variable filter 61. The reception-side amplification circuit 72 includes a so-called LNA (low noise amplifier). The reception-side amplification circuit 72 amplifies a reception signal output from the frequency-variable filter 62 and outputs it to the demodulator 802.

The channel determination unit 810 of the signal processor 80 detects the vacant communication channels in the communication band. For example, the channel determination unit 810 acquires a map of the vacant channels from the outside and detects the vacant channels based on the map. The channel determination unit 810 selects at least one of the vacant communication channels and sets it as the selected channel. The channel determination unit 810 outputs the selected channel to the transmission signal generator 801. The transmission signal generator 801 generates the transmission signal with a high-frequency signal having a frequency of the selected channel and outputs it to the transmission-side amplification circuit 71. Although not illustrated in the drawing, the channel determination unit 810 outputs the selected channel to the demodulator 802. The demodulator 802 demodulates the reception signal with a local signal based on the selected channel.

The channel determination unit 810 also outputs the selected channel to the frequency-variable LC filter 40, the transmission-side amplification circuit 71, the frequency-variable filter 61, and the frequency-variable filter 62. The frequency-variable LC filter 40, the frequency-variable filter 61, and the frequency-variable filter 62 achieve the above-described filter characteristics using the selected channel. The transmission-side amplification circuit 71 performs amplification processing on the transmission signal using the selected channel.

As described above, when wireless communication is performed using the selected communication channel (selected channel) in the communication band configured by the plurality of communication channels, usage of the configuration of the high-frequency front end circuit 10 in the embodiment can achieve the wireless communication with low loss using the selected channel.

It should be noted that the communication channel may be determined by the following method. The high-frequency front end circuit includes a detector. The detector may be connected to the diplexer 50 at the antenna ANT side and may be connected to another antenna for reception level detection. When there is the plurality of vacant communication channels, the detector detects respective reception levels of the plurality of vacant communication channels. The detector outputs the reception levels to the channel determination unit 810. The channel determination unit 810 selects, as the communication channel, the vacant communication channel having the highest reception level among the plurality of detected reception levels.

Figure 9:
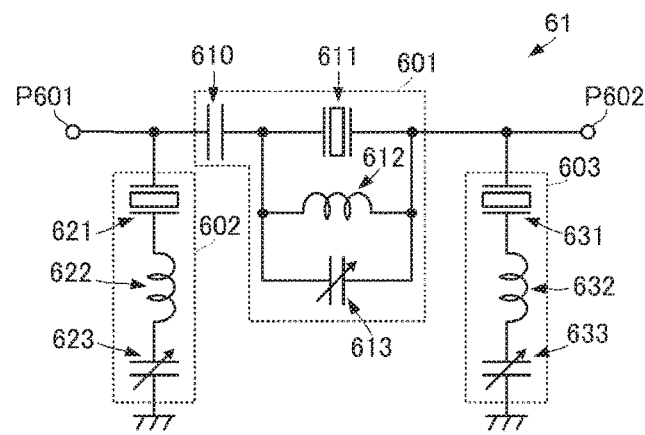
FIG. 9 is a circuit diagram of a frequency-variable filter of an elastic wave resonator filter type in the embodiment of the present disclosure.

It should be noted that the frequency-variable filters 61 and 62 can have the following circuit configuration. FIG. 9 is a circuit diagram of the frequency-variable filter of the resonator filter type in the embodiment of the present disclosure. As described above, the frequency-variable filters 61 and 62 have the same basic configuration excluding setting of the frequency and the frequency-variable filter 61 is therefore described.

The frequency-variable filter 61 includes a series arm resonance circuit 601, a first parallel arm resonance circuit 602, a second parallel arm resonance circuit 603, a connection terminal P601 as an input terminal, and a connection terminal P602 as an output terminal.

The series arm resonance circuit 601 is connected between the connection terminal P601 and the connection terminal P602. The first parallel arm resonance circuit 602 is connected between the series arm resonance circuit 601 at the connection terminal P601 side and a ground potential. The second parallel arm resonance circuit 603 is connected between the series arm resonance circuit 601 at the connection terminal P602 side and the ground potential.

The series arm resonance circuit 601 includes a capacitor 610, an elastic wave resonator 611, an inductor 612, and a variable capacitor 613. The elastic wave resonator 611, the inductor 612, and the variable capacitor 613 are connected in parallel. The capacitor 610 is connected in series to the parallel circuit. The resonance circuit is connected between the connection terminal P601 and the connection terminal P602. In this case, the capacitor 610 is connected to the connection terminal P601, that is, connected to the first parallel arm resonance circuit 602.

The first parallel arm resonance circuit 602 includes an elastic wave resonator 621, an inductor 622, and a variable capacitor 623. The elastic wave resonator 621, the inductor 622, and the variable capacitor 623 are connected in series. The series resonance circuit is connected between the connection terminal P601 and the ground potential.

The second parallel arm resonance circuit 603 includes an elastic wave resonator 631, an inductor 632, and a variable capacitor 633. The elastic wave resonator 631, the inductor 632, and the variable capacitor 633 are connected in series. The series resonance circuit is connected between the connection terminal P602 and the ground potential.

The series arm resonance circuit 601 and the first and second parallel arm resonance circuits 602 and 603 are band pass filters using resonance points and anti-resonance points of the elastic wave resonators 611, 621, and 631, respectively. The frequency-variable filter 61 functions as a band pass filter having the pass band that is changed by changing the capacitances of the variable capacitors 613, 623, and 633.

An impedance of the elastic wave resonator 621 is lower than an impedance of the elastic wave resonator 631.

Figure 10:
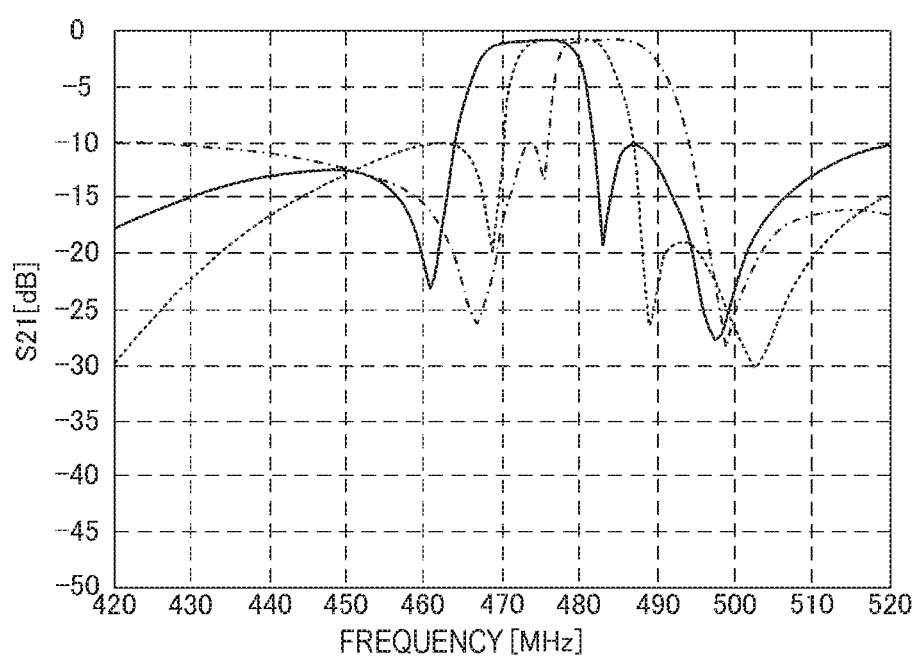
FIG. 10 is a graph illustrating bandpass characteristics of the frequency-variable filter illustrated in FIG. 9.

FIG. 10 is a graph illustrating bandpass characteristics of the frequency-variable filter illustrated in FIG. 9. As illustrated in FIG. 10, usage of the frequency-variable filter 61 can achieve filter characteristics having the pass band width of approximately 10 [MHz] and having the attenuation poles at both sides of the pass band. In particular, the attenuation poles having steep attenuation characteristics and large attenuations can be formed at both sides of the pass band on the frequency axis by connecting the capacitor to the series arm resonance circuit 601 at the first parallel arm resonance circuit 602 side, in other words, by connecting the capacitor to the side of the resonance filter including the elastic wave resonator having a smaller impedance, as illustrated in FIG. 9. Therefore, the high-frequency signals in the frequency bands of the channels adjacent to the selected channel can be largely attenuated.

Figure 11A:
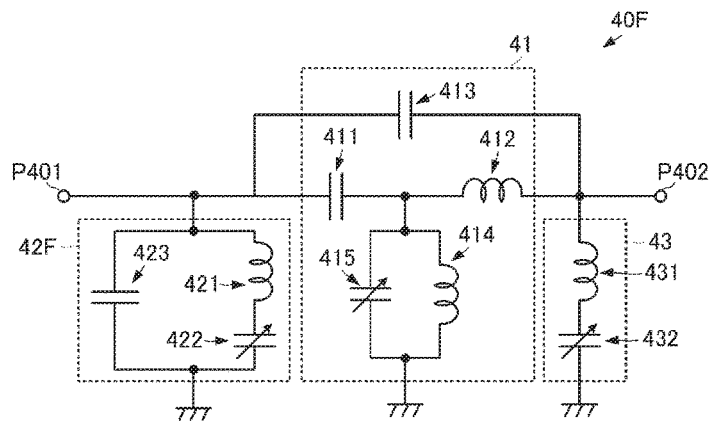
FIG. 11A is a circuit diagram of a frequency-variable LC filter according to a fourth embodiment of the present disclosure and FIG. 11B is a graph illustrating bandpass characteristics of the frequency-variable LC filter and bandpass characteristics of a frequency-variable LC filter according to a comparative example.

Next, FIG. 11A is a circuit diagram of a frequency-variable LC filter 40F according to a fourth embodiment of the present disclosure.

The frequency-variable LC filter 40F is different from the frequency-variable LC filter 40 in the first embodiment in a point that it includes a first parallel arm LC filter circuit 42F in order to further improve the steepness of the attenuation characteristics. The first parallel arm LC filter circuit 42F is configured by adding a fixed capacitor 423 to the first parallel arm LC filter circuit 42.

As illustrated in FIG. 11A, the fixed capacitor 423 is connected in parallel to a series circuit formed by the inductor 421 and the variable capacitor 422. A frequency at an anti-resonant point of a circuit formed by the inductor 421 and the fixed capacitor 423 is set to the low frequency side of a pass band of the frequency-variable LC filter 40F. This makes the attenuation characteristics of the frequency-variable LC filter 40F at the low frequency side of the pass band steeper as illustrated in the following characteristic graph.

Figure 11B:
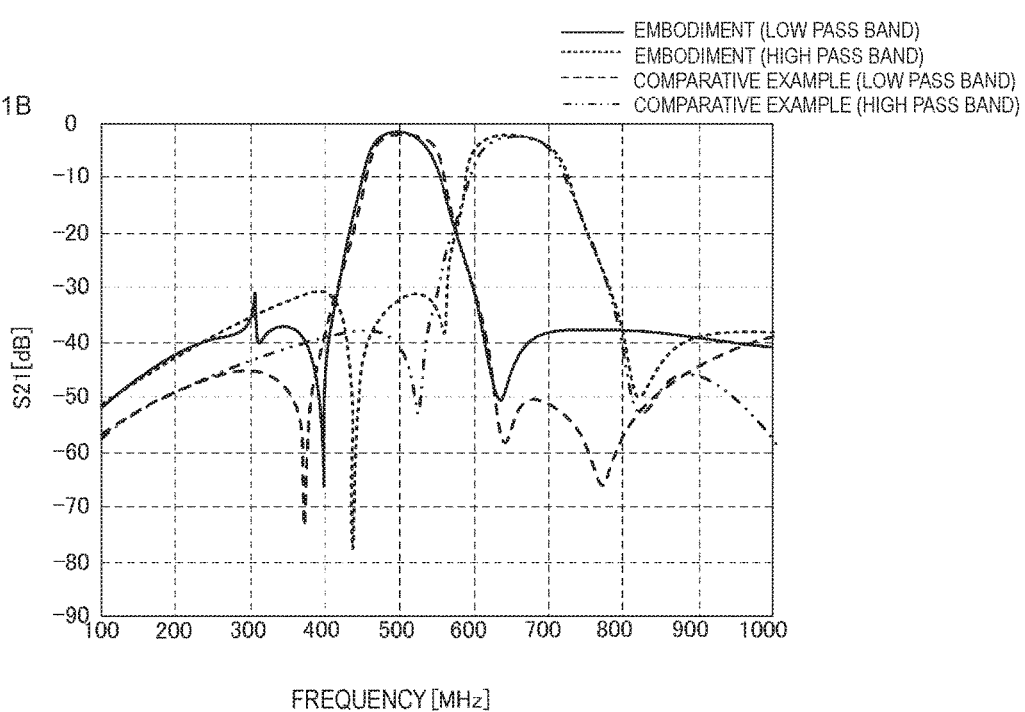

FIG. 11B is a graph illustrating bandpass characteristics of the frequency-variable LC filter 40F and bandpass characteristics of a frequency-variable LC filter according to a comparative example. In the characteristic graph in FIG. 11B, a solid line and a dotted line indicate the bandpass characteristics of the frequency-variable LC filter 40F and a dashed line and a long dashed double-dotted line indicate the bandpass characteristics of the frequency-variable LC filter in the comparative example. The dotted line and the long dashed double-dotted line indicate characteristic graphs when the pass bands indicated by the solid line and the dashed line are respectively changed to the higher frequency side. It should be noted that the frequency-variable LC filter 40 in the first embodiment is used as the frequency-variable LC filter in the comparative example.

As indicated by the solid line and the dashed line in FIG. 11B, the frequency-variable LC filter 40F can transmit signals in the pass band with low loss at substantially the same degree as the frequency-variable LC filter 40 in the comparative example. The frequency (approximately 400 MHz) of the attenuation pole of the frequency-variable LC filter 40F at the low frequency side is closer to the pass band than the frequency (approximately 380 MHz) of the attenuation pole of the frequency-variable LC filter in the comparative example at the low frequency side. The attenuation (dB) of the frequency-variable LC filter 40F is larger than the attenuation of the frequency-variable LC filter in the comparative example at frequencies around the frequency of the attenuation pole at the low frequency side. That is to say, the attenuation characteristics of the frequency-variable LC filter 40F in the embodiment are steeper than the attenuation characteristics of the frequency-variable LC filter in the comparative example. As indicated by the dotted line and the long dashed double-dotted line in FIG. 11B, this improvement in the steepness can also be provided even when the pass band is changed to the higher frequency side.

Figure 12A:
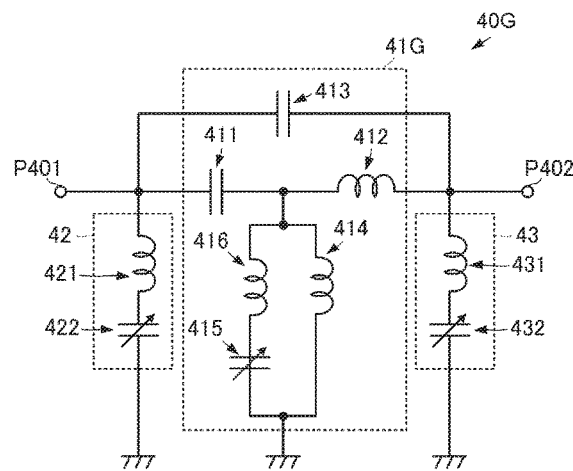
FIG. 12A is a circuit diagram of a frequency-variable LC filter according to a fifth embodiment of the present disclosure and FIG. 12B is a graph illustrating bandpass characteristics of the frequency-variable LC filter and bandpass characteristics of a frequency-variable LC filter according to a comparative example.
Figure 12B:
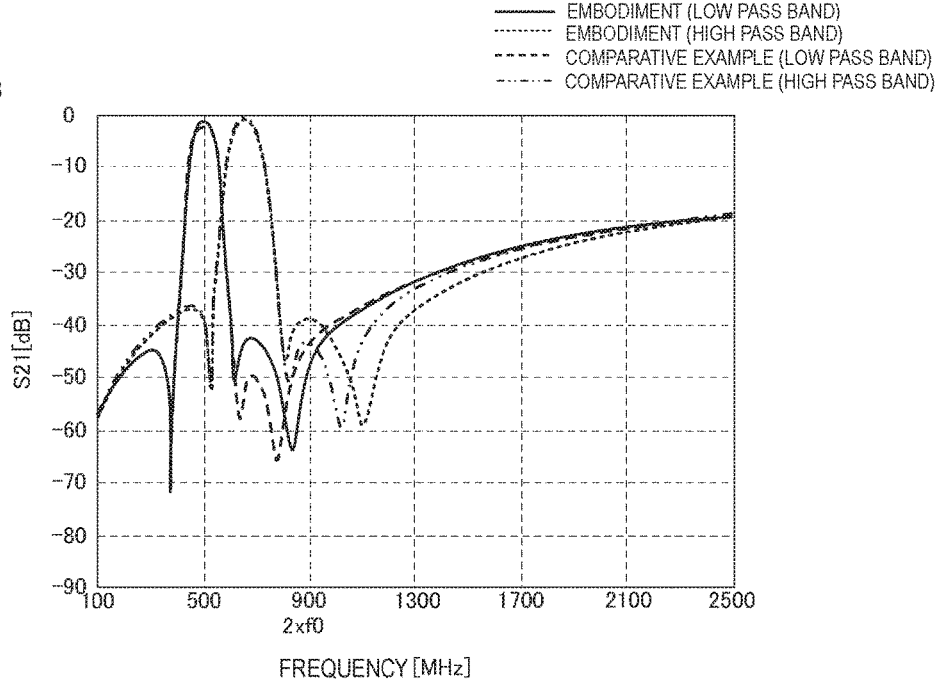

FIG. 12A is a circuit diagram of a frequency-variable LC filter 40G according to a fifth embodiment of the present disclosure and FIG. 12B is a graph illustrating bandpass characteristics of the frequency-variable LC filter 40G and bandpass characteristics of a frequency-variable LC filter according to a comparative example. It should be noted that the frequency-variable LC filter 40 is used as the frequency-variable LC filter in the comparative example.

The frequency-variable LC filter 40G is different from the frequency-variable LC filter 40 in a point that it includes a first series arm LC filter circuit 41G in order to further improve the attenuation characteristics for harmonics of signals in the pass band. The first series arm LC filter circuit 41G is configured by adding an inductor 416 to the first series arm LC filter circuit 41.

As illustrated in FIG. 12A, the inductor 416 is connected in series to the variable capacitor 415. The series circuit is connected in parallel to the inductor 414. A frequency at a resonant point of the series circuit is set to the high frequency side of the pass band of the frequency-variable LC filter 40G. Therefore, the attenuation characteristics of the frequency-variable LC filter 40G for the harmonics are improved as illustrated in the following characteristic graph.

As indicated by a solid line and a dashed line in FIG. 12B, the attenuation of the frequency-variable LC filter 40G is larger than the attenuation of the frequency-variable LC filter in the comparative example at a frequency (approximately 900 MHz) that is 2-fold of the center frequency of the pass band of the frequency-variable LC filter 40G. As indicated by a dotted line and a long dashed double-dotted line in FIG. 12B, increase in the attenuation for the second harmonic can also be provided even when the pass band is changed to the high frequency side.

Figure 13A:
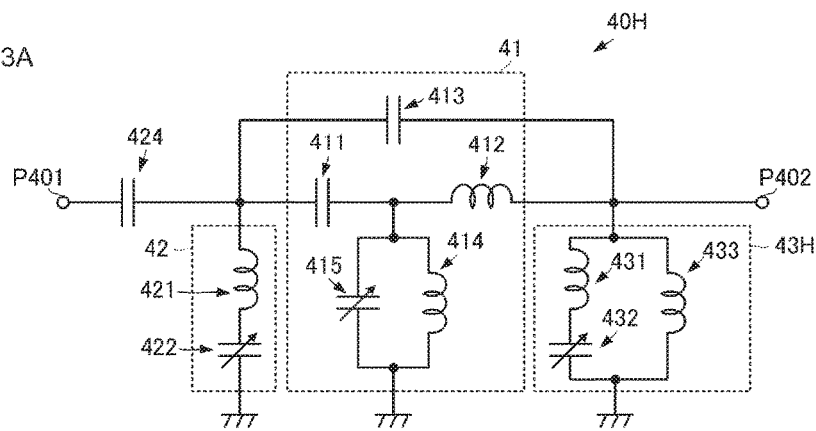
FIG. 13A is a circuit diagram of a frequency-variable LC filter according to a sixth embodiment of the present disclosure and FIG. 13B is a graph illustrating bandpass characteristics of the frequency-variable LC filter and bandpass characteristics of a frequency-variable LC filter according to a comparative example.
Figure 13B:
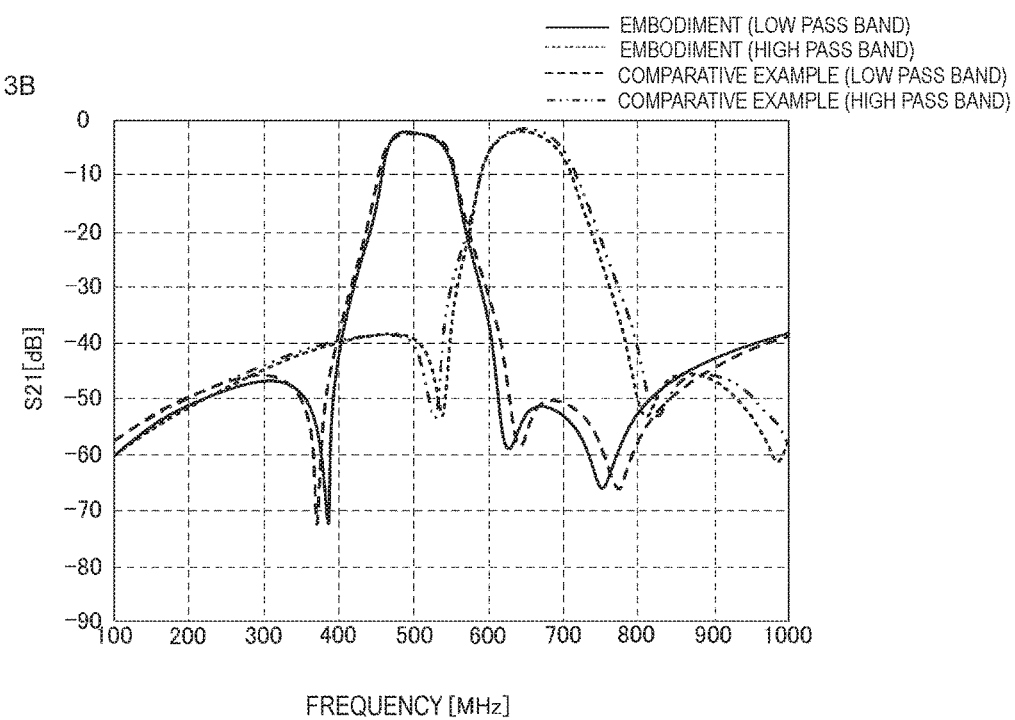

Next, FIG. 13A is a circuit diagram of a frequency-variable LC filter 40H according to a sixth embodiment of the present disclosure and FIG. 13B is a graph illustrating bandpass characteristics of the frequency-variable LC filter and bandpass characteristics of a frequency-variable LC filter according to a comparative example. It should be noted that the frequency-variable LC filter 40 is used as the frequency-variable LC filter in the comparative example.

The frequency-variable LC filter 40H is different from the frequency-variable LC filter 40 in a point that it includes a fixed capacitor 424 and a second parallel arm LC filter circuit 43H in order to further improve the attenuation characteristics at the low frequency side and the high frequency side of the pass band. The second parallel arm LC filter circuit 43H is configured by adding an inductor 433 to the second parallel arm LC filter circuit 43.

As illustrated in FIG. 13A, the fixed capacitor 424 is connected in series between the first connection terminal P401 and the first series arm LC filter circuit 41. The first parallel arm LC filter circuit 42, the fixed capacitor 411, and the fixed capacitor 424 form a T-shaped high pass filter circuit. The T-shaped high pass filter circuit improves the steepness of the attenuation characteristics at the low frequency side of the pass band as illustrated in the following characteristic graph.

The inductor 433 of the second parallel arm LC filter circuit 43H is connected in parallel to the series circuit formed by the inductor 431 and the variable capacitor 432. A frequency at an anti-resonant point of a parallel circuit formed by the inductor 433 and the variable capacitor 432 is set to the high frequency side of the pass band of the frequency-variable LC filter 40H. This improves the steepness of the attenuation characteristics at the high frequency side of the pass band as illustrated in the following characteristic graph.

As indicated by a solid line and a dashed line in FIG. 13B, the frequency-variable LC filter 40H can transmit signals in the pass band with low loss at substantially the same degree as the frequency-variable LC filter 40 in the comparative example. The frequency (approximately 390 MHz) of the attenuation pole of the frequency-variable LC filter 40H at the low frequency side is closer to the pass band than the frequency (approximately 380 MHz) of the attenuation pole of the frequency-variable LC filter in the comparative example at the low frequency side. The attenuation (dB) of the frequency-variable LC filter 40H is larger than the attenuation of the frequency-variable LC filter in the comparative example at frequencies around the frequency of the attenuation pole at the low frequency side. The frequency (approximately 620 MHz) of the attenuation pole of the frequency-variable LC filter 40H at the high frequency side is closer to the pass band than the frequency (approximately 650 MHz) of the attenuation pole of the frequency-variable LC filter in the comparative example at the high frequency side. The attenuation (dB) of the frequency-variable LC filter 40H is larger than the attenuation of the frequency-variable LC filter in the comparative example at frequencies around the frequency of the attenuation pole at the high frequency side. That is to say, the attenuation characteristics of the frequency-variable LC filter 40H in the embodiment are steeper than the attenuation characteristics of the frequency-variable LC filter in the comparative example. As indicated by the dotted line and the long dashed double-dotted line in FIG. 13B, this improvement in the steepness can also be provided even when the pass band is changed to the high frequency side.

Figure 14:
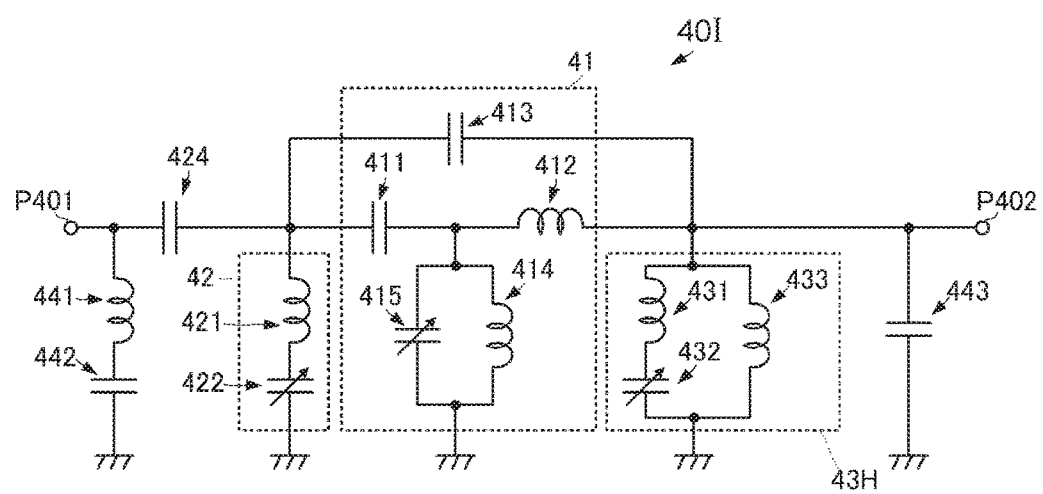
FIG. 14 is a circuit diagram of a frequency-variable LC filter according to a seventh embodiment of the present disclosure.
Figure 15A:
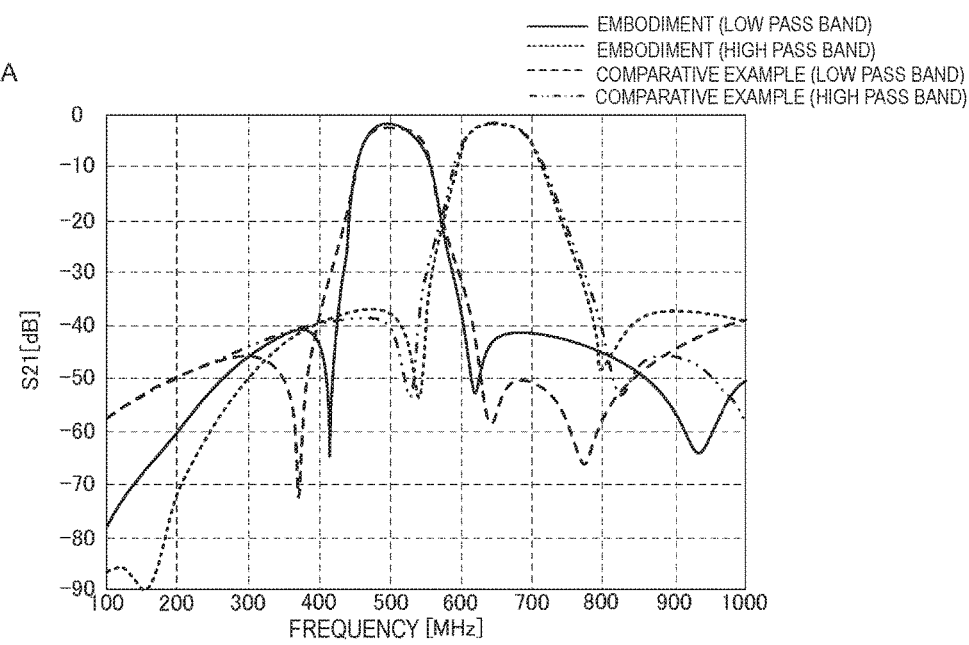
FIGS. 15A and 15B are graphs illustrating bandpass characteristics of the frequency-variable LC filter in the seventh embodiment of the present disclosure and bandpass characteristics of a frequency-variable LC filter according to a comparative example.
Figure 15B:
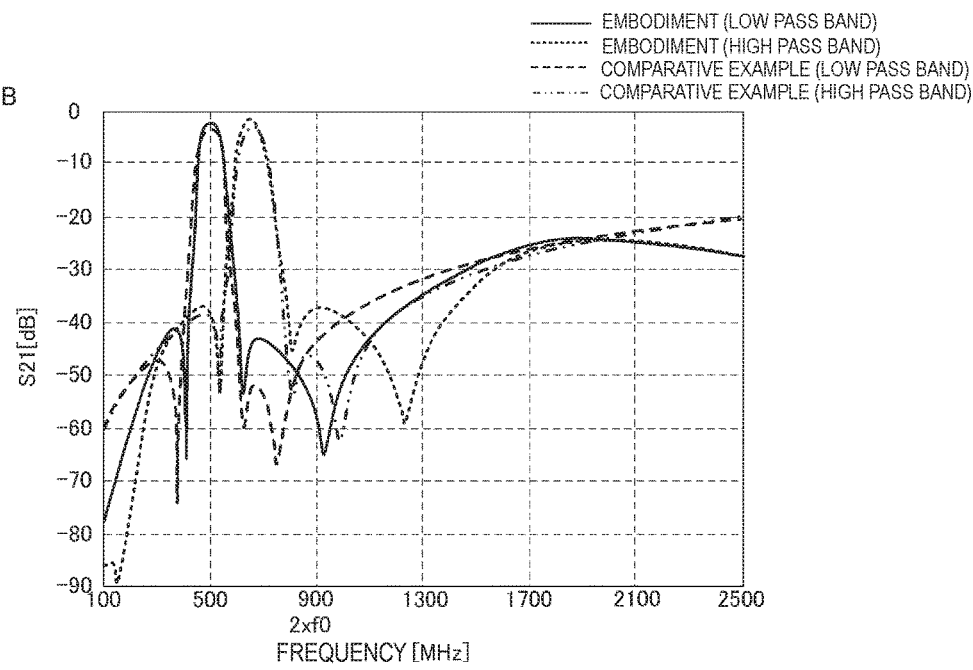

Next, FIG. 14 is a circuit diagram of a frequency-variable LC filter 40I according to a seventh embodiment of the present disclosure. FIGS. 15A and 15B are graphs illustrating bandpass characteristics of the frequency-variable LC filter 40I in the seventh embodiment of the present disclosure and bandpass characteristics of a frequency-variable LC filter according to a comparative example. It should be noted that the frequency-variable LC filter 40 is used as the frequency-variable LC filter in the comparative example.

The frequency-variable LC filter 40I is configured by adding an inductor 441, a fixed capacitor 442, and a fixed capacitor 443 to the frequency-variable LC filter 40H. With this configuration, the frequency-variable LC filter 40I not only improves the steepness of the attenuation characteristics but also increases the attenuation for harmonics of signals in the pass band and increases the attenuation at the lower frequency side than the attenuation pole at the low frequency side.

One end of a series circuit formed by the inductor 441 and the fixed capacitor 442 is connected to a path between the first connection terminal P401 and the fixed capacitor 424 and the other end thereof is connected to the ground potential. A frequency at a resonant point of this series circuit is, for example, 150 MHz, and is set to be lower than the frequency of the attenuation pole at the low frequency side. Therefore, the attenuation of the frequency-variable LC filter 40I is increased at the lower frequency side than the attenuation pole at the low frequency side as illustrated in the following characteristic graph. One end of the fixed capacitor 443 is connected to a path between the second connection terminal P402 and the second parallel arm LC filter circuit 43H and the other end thereof is connected to the ground potential. The fixed capacitor 443 increases the attenuation of the frequency-variable LC filter 40I for the harmonics as illustrated in the following characteristic graph.

As indicated by a solid line and a dashed line in FIG. 15A, the frequency-variable LC filter 40I can transmit signals in the pass band with low loss at substantially the same degree as the frequency-variable LC filter 40 in the comparative example. The frequency (approximately 410 MHz) of the attenuation pole of the frequency-variable LC filter 40I at the low frequency side is closer to the pass band than the frequency (approximately 380 MHz) of the attenuation pole of the frequency-variable LC filter in the comparative example at the low frequency side. The attenuation (dB) of the frequency-variable LC filter 40I is larger than the attenuation of the frequency-variable LC filter in the comparative example at frequencies around the frequency of the attenuation pole at the low frequency side. The frequency (approximately 620 MHz) of the attenuation pole of the frequency-variable LC filter 40I at the high frequency side is closer to the pass band than the frequency (approximately 650 MHz) of the attenuation pole of the frequency-variable LC filter in the comparative example at the high frequency side. The attenuation (dB) of the frequency-variable LC filter 40I is larger than the attenuation of the frequency-variable LC filter in the comparative example at frequencies around the frequency of the attenuation pole at the high frequency side. That is to say, the attenuation characteristics of the frequency-variable LC filter 40I in the embodiment are steeper than the attenuation characteristics of the frequency-variable LC filter in the comparative example. As indicated by a dotted line and a long dashed double-dotted line in FIG. 15A, this improvement in the steepness can also be provided even when the pass band is changed to the high frequency side.

As indicated by the solid line and the dashed line in FIG. 15A, the attenuation of the frequency-variable LC filter 40I is larger than the attenuation of the frequency-variable LC filter in the comparative example in a band of equal to or higher than 100 MHz and equal to or lower than 300 MHz. As indicated by the dotted line and the long dashed double-dotted line in FIG. 15A, increase in the attenuation at the lower frequency side relative to the attenuation pole at the low frequency side can also be provided even when the pass band is changed to the high frequency side.

As indicated by a solid line and a dashed line in FIG. 15B, the attenuation of the frequency-variable LC filter 40I is larger than the attenuation of the frequency-variable LC filter in the comparative example at a 2-fold frequency (approximately 900 MHz) of the center frequency of the pass band of the frequency-variable LC filter 40I. As indicated by a dotted line and a long dashed double-dotted line in FIG. 15B, the increase in the attenuation for the second harmonic can also be provided even when the pass band is changed to the high frequency side.

Figure 16A:
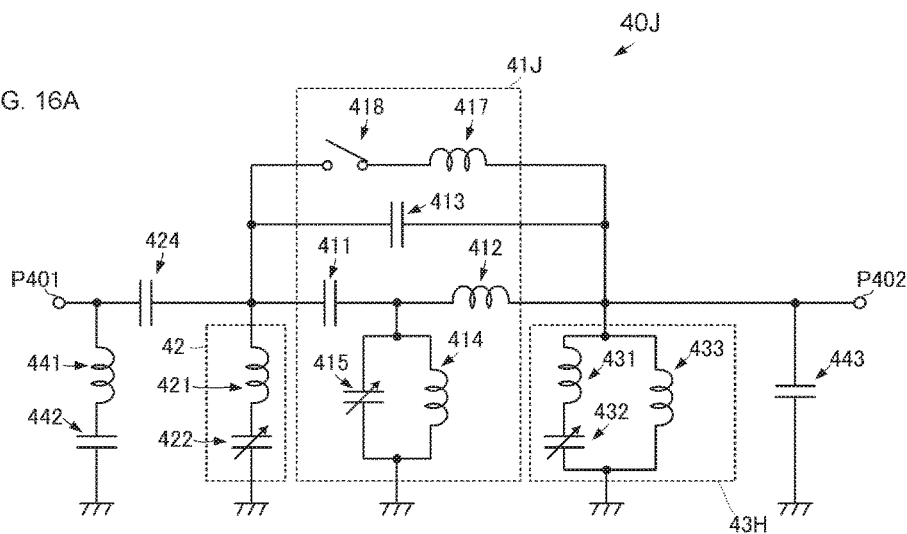
FIG. 16A is a circuit diagram of a frequency-variable LC filter according to an eighth embodiment of the present disclosure and FIG. 16B is a graph illustrating bandpass characteristics of the frequency-variable LC filter and bandpass characteristics of a frequency-variable LC filter according to a comparative example.
Figure 16B:
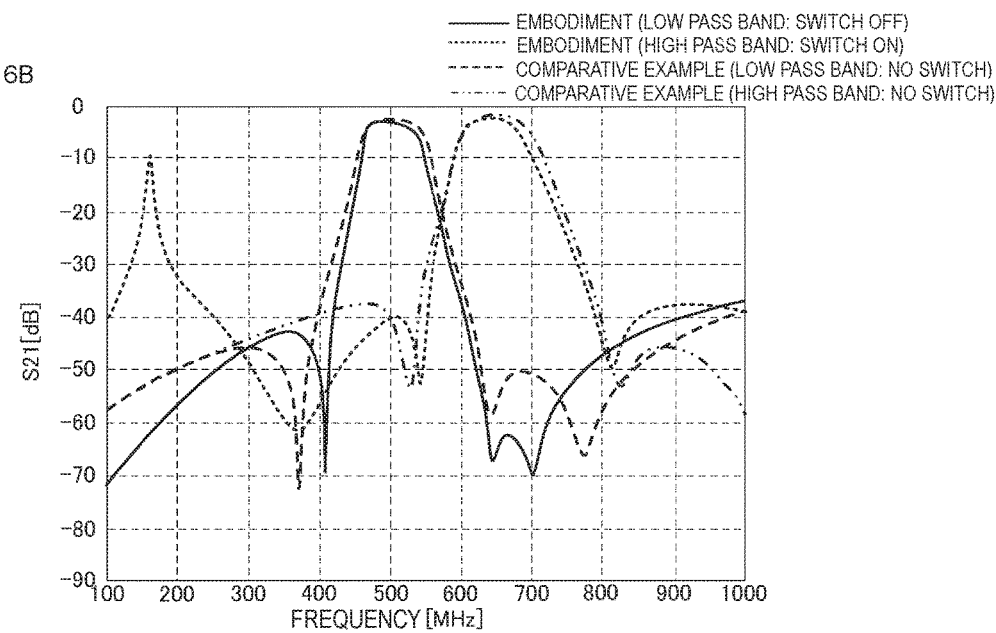

Next, FIG. 16A is a circuit diagram of a frequency-variable LC filter 40J according to an eighth embodiment of the present disclosure and FIG. 16B is a graph illustrating bandpass characteristics of the frequency-variable LC filter 40J and bandpass characteristics of a frequency-variable LC filter according to a comparative example. It should be noted that the frequency-variable LC filter 40I is used as the frequency-variable LC filter in the comparative example.

The frequency-variable LC filter 40J is different from the frequency-variable LC filter 40I in a point that it includes a first series arm LC filter circuit 41J. The first series arm LC filter circuit 41J is configured by adding an inductor 417 and a switch 418 to the first series arm LC filter circuit 40I. The frequency-variable LC filter 40J provides desired attenuation characteristics by short-circuiting or opening of the switch 418 with change of the pass band.

As illustrated in FIG. 16A, a series circuit formed by the inductor 417 and the switch 418 is connected in parallel to the fixed capacitor 413. In other words, the series circuit is connected in parallel to the series circuit formed by the inductor 412 and the fixed capacitor 411.

The switch 418 is short-circuited when the pass band of the frequency-variable LC filter 40J is changed to the high frequency side. The switch 418 is opened when the pass band of the frequency-variable LC filter 40J is changed to the low frequency side. It should be noted that the switch 418 is short-circuited or opened based on information of the selected channel, which is output from the channel determination unit 810. The switch 418 is therefore short-circuited or opened together with change of the capacitances of the variable capacitors 422, 415, and 432.

In the characteristic graph in FIG. 16B, a solid line indicates the bandpass characteristics of the frequency-variable LC filter 40J when the pass band is changed to the low frequency side and the switch 418 is opened. A dotted line indicates the bandpass characteristics of the frequency-variable LC filter 40J when the pass band is changed to the high frequency side and the switch 418 is short-circuited. As indicated by a long dashed double-dotted line in FIG. 16B, when the pass band of the frequency-variable LC filter in the comparative example is changed to the high frequency side, the attenuation is a minimum value at a frequency of around 450 MHz which is lower than the attenuation pole at the low frequency side. As indicated by the dotted line in FIG. 16B, when the pass band of the frequency-variable LC filter 40J in the embodiment is changed to the high frequency side, the attenuation is a minimum value at a frequency of around 510 MHz which is lower than the attenuation pole at the low frequency side, in the same manner. At the low frequency side of the pass band, the minimum value (approximately 40 dB) of the attenuation of the frequency-variable LC filter 40J is larger than the minimum value (approximately 38 dB) of the attenuation of the frequency-variable LC filter in the comparative example. In other words, the frequency-variable LC filter 40J can ensure the attenuation, which is larger than the minimum attenuation of the frequency-variable LC filter in the comparative example, at the low frequency side of the pass band.

When the pass band is changed to the low frequency side and the switch 418 is opened, the circuit configuration of the frequency-variable LC filter 40J becomes equal to the circuit configuration of the frequency-variable LC filter 40I. Therefore, the bandpass characteristics of the frequency-variable LC filter 40J also become equal to the bandpass characteristics of the frequency-variable LC filter 40I. That is to say, the switch 418 is opened when the pass band is changed to the low frequency side, so that the frequency-variable LC filter 40J can keep the bandpass characteristics of the frequency-variable LC filter 40I.

In the embodiment, the switch 418 is short-circuited only when the pass band is changed to the high frequency side. Alternatively, the frequency-variable LC filter 40J may employ a mode in which the switch 418 is short-circuited only when the pass band is changed to the low frequency side depending on respective element values.

Figure 17:
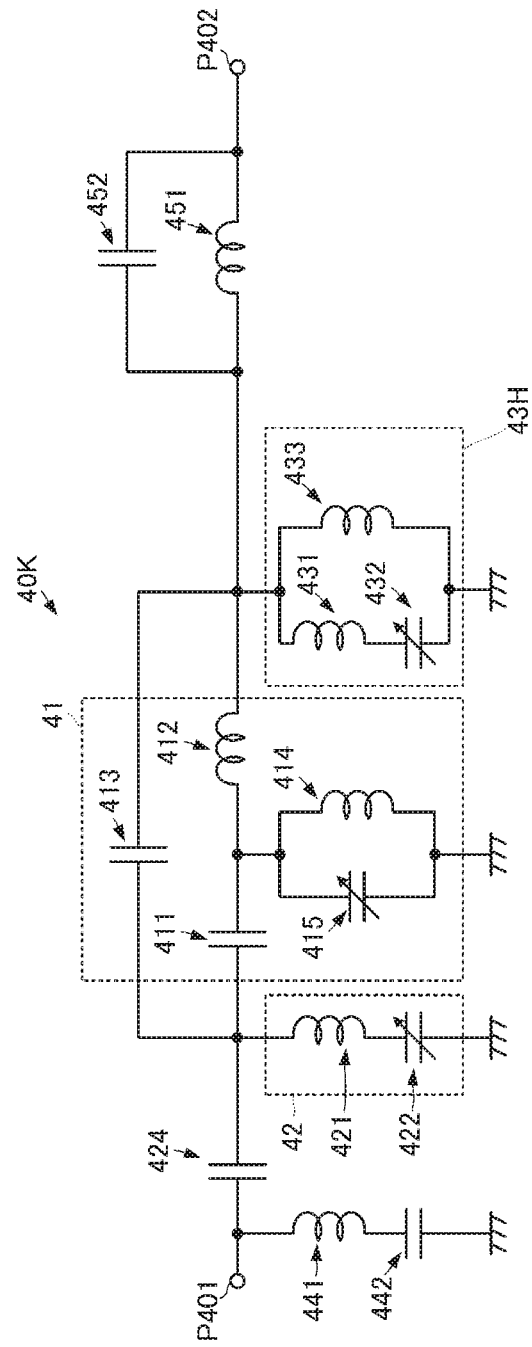
FIG. 17 is a circuit diagram of a frequency-variable LC filter according to a ninth embodiment of the present disclosure.
Figure 18:
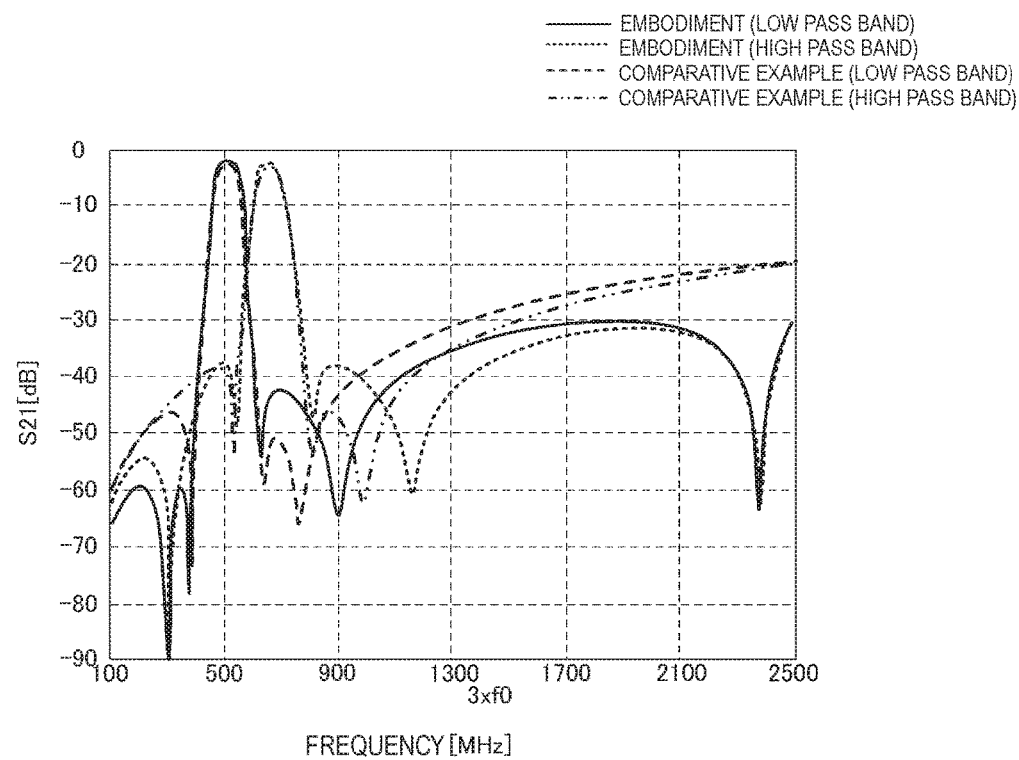
FIG. 18 is a graph illustrating bandpass characteristics of the frequency-variable LC filter in the ninth embodiment of the present disclosure and bandpass characteristics of a frequency-variable LC filter according to a comparative example.

Next, FIG. 17 is a circuit diagram of a frequency-variable LC filter 40K according to a ninth embodiment of the present disclosure. FIG. 18 is a graph illustrating bandpass characteristics of the frequency-variable LC filter 40K and bandpass characteristics of a frequency-variable LC filter according to a comparative example. It should be noted that the frequency-variable LC filter 40 is used as the frequency-variable LC filter in the comparative example.

The frequency-variable LC filter 40K is configured by adding an inductor 451 and a fixed capacitor 452 to the frequency-variable LC filter 40I in order to increase the attenuation for a third harmonic of the signal in the pass band.

As illustrated in FIG. 17, one end of the inductor 451 is connected to the second connection terminal P402 and the other end thereof is connected to the first series arm LC filter circuit 41 (or the second series arm LC filter circuit 43H). The fixed capacitor 452 is connected in parallel to the inductor 451. A frequency at a resonant point of a parallel circuit formed by the inductor 451 and the fixed capacitor 452 is set to be higher than the pass band of the frequency-variable LC filter 40K. To be more specific, the frequency at the resonant point is, for example, 2300 MHz and is higher than a 3-fold frequency (1350 MHz) of the center frequency of the pass band.

As indicated by a solid line and a dashed line in the characteristic graph in FIG. 18, the attenuation of the frequency-variable LC filter 40K is larger than the attenuation of the frequency-variable LC filter in the comparative example at a frequency of around 1350 MHz.

As indicated by a dotted line and a long dashed double-dotted line in FIG. 18, the attenuation of the frequency-variable LC filter 40K is also larger than the attenuation of the frequency-variable LC filter in the comparative example at a frequency of around 1950 MHz even when the pass band is changed to the high frequency side. It should be noted that the center frequency of the pass band changed to the high frequency side is approximately 650 MHz(=1950/3 MHz).

Figure 19:
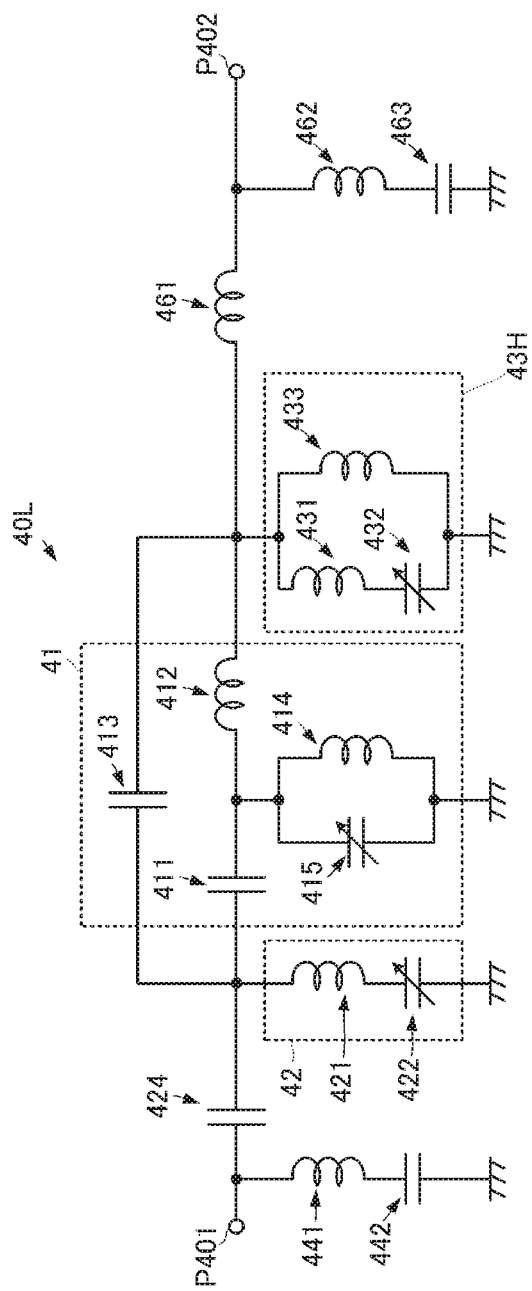
FIG. 19 is a circuit diagram of a frequency-variable LC filter according to a tenth embodiment of the present disclosure.
Figure 20:
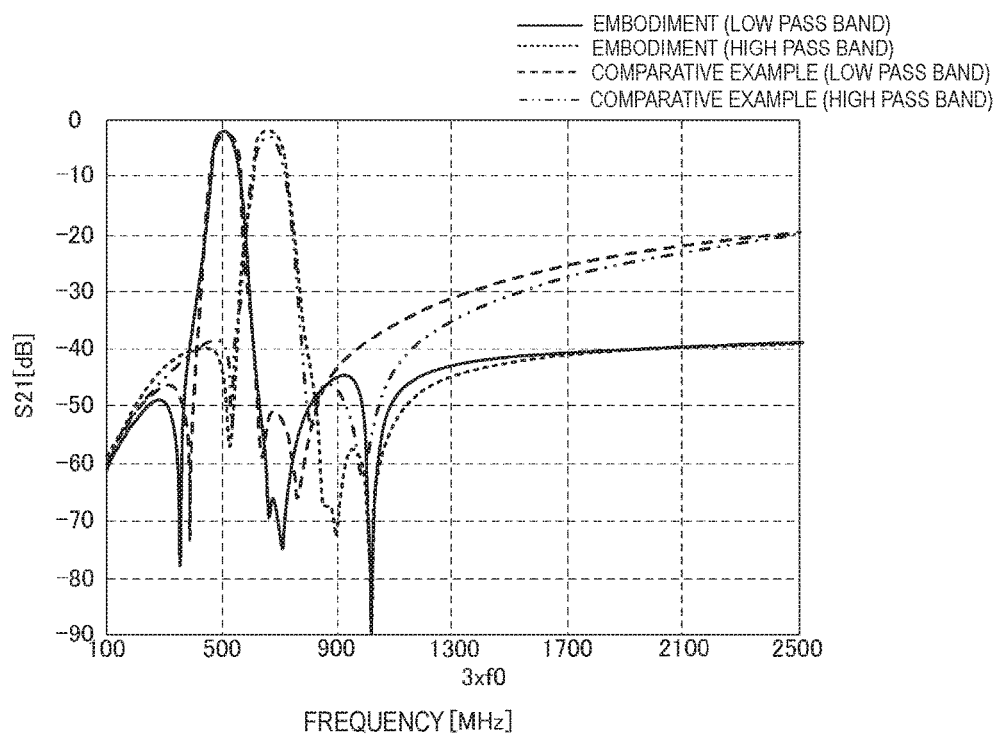
FIG. 20 is a graph illustrating bandpass characteristics of the frequency-variable LC filter in the tenth embodiment of the present disclosure and bandpass characteristics of a frequency-variable LC filter according to a comparative example.

Next, FIG. 19 is a circuit diagram of a frequency-variable LC filter 40L according to a tenth embodiment of the present disclosure. FIG. 20 is a graph illustrating bandpass characteristics of the frequency-variable LC filter 40L in the tenth embodiment of the present disclosure and bandpass characteristics of a frequency-variable LC filter according to a comparative example. It should be noted that the frequency-variable LC filter 40 is used as the frequency-variable LC filter in the comparative example.

The frequency-variable LC filter 40L is configured by adding an inductor 461, an inductor 462, and a fixed capacitor 463 to the frequency-variable LC filter 40I in order to increase the attenuation for the third harmonic of the signal in the pass band.

One end of the inductor 461 is connected to the second connection terminal P402 and the other end thereof is connected to the first series arm LC filter circuit 41 (or the second series arm LC filter circuit 43H). A series circuit formed by the inductor 462 and the fixed capacitor 463 is connected between the second connection terminal P402 and the ground potential. The inductors 461 and 462 and the fixed capacitor 463 form a low pass filter having a cutoff frequency of approximately 2000 MHz.

As indicated by a solid line and a dashed line in the characteristic graph in FIG. 20, the attenuation (42 dB) of the frequency-variable LC filter 40L is larger than the attenuation (30 dB) of the frequency-variable LC filter in the comparative example at a frequency of around 1350 MHz.

As indicated by a dotted line and a long dashed double-dotted line in FIG. 20, the attenuation (43 dB) of the frequency-variable LC filter 40L is also larger than the attenuation (34 dB) of the frequency-variable LC filter in the comparative example at a frequency of around 1950 MHz even when the pass band is changed to the high frequency side. It should be noted that the center frequency of the pass band changed to the high frequency side is approximately 650 MHz(=1950/3 MHz).

Figure 21:
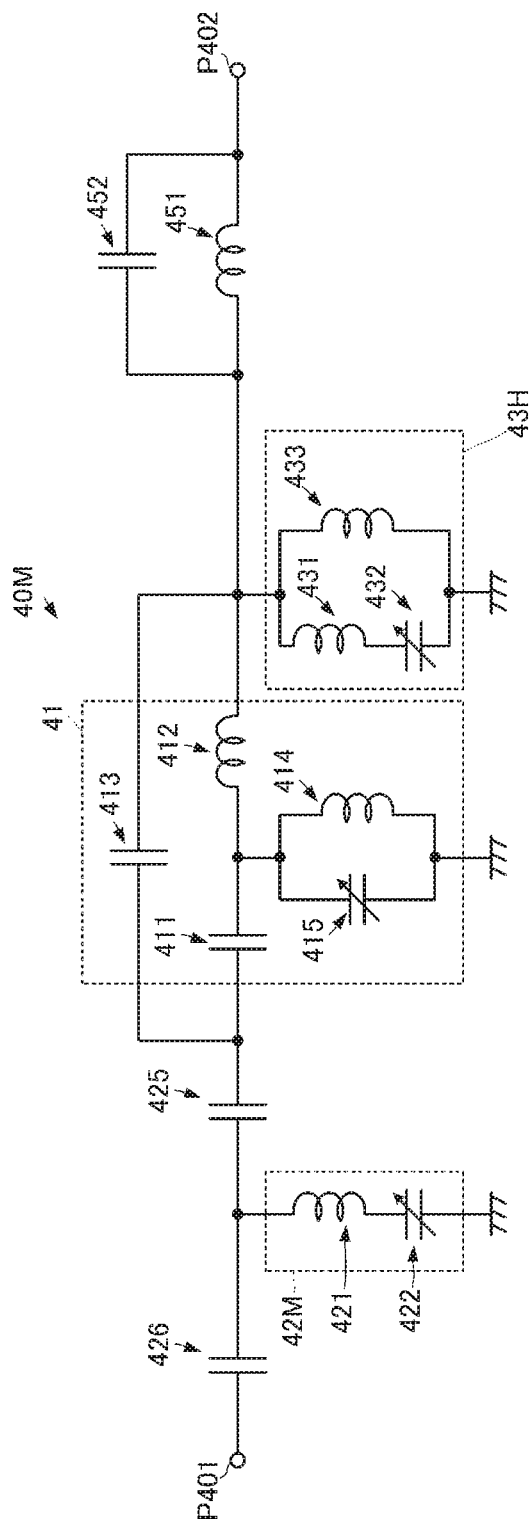
FIG. 21 is a circuit diagram of a frequency-variable LC filter according to an eleventh embodiment of the present disclosure.
Figure 22A:
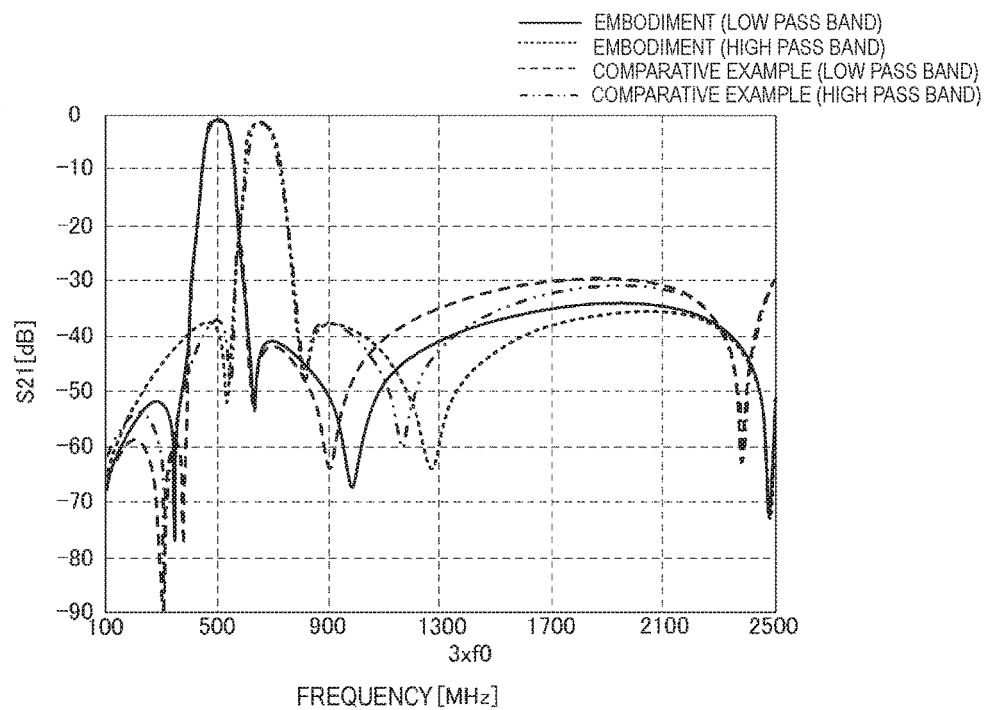
FIG. 22A is a graph illustrating bandpass characteristics of the frequency-variable LC filter in the eleventh embodiment of the present disclosure and bandpass characteristics of a frequency-variable LC filter according to a comparative example.
Figure 22B:
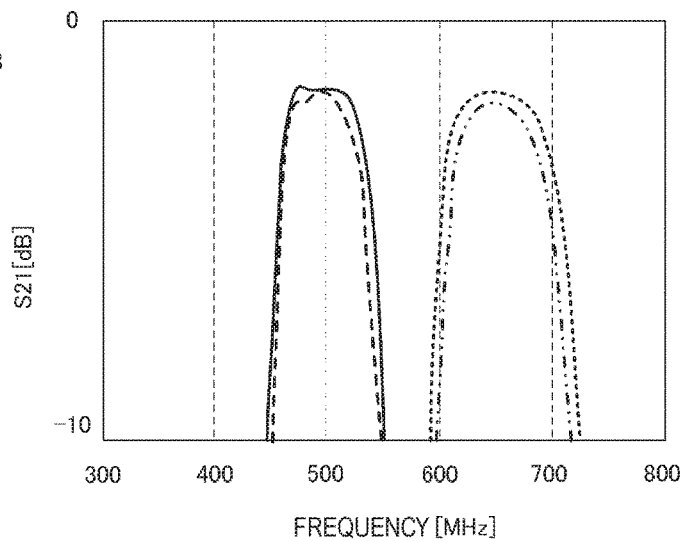
FIG. 22B is a partially enlarged view of the characteristic graph illustrated in FIG. 22A.

Next, FIG. 21 is a circuit diagram of a frequency-variable LC filter 40M according to an eleventh embodiment of the present disclosure. FIG. 22A is a graph illustrating bandpass characteristics of the frequency-variable LC filter 40M in the eleventh embodiment of the present disclosure and bandpass characteristics of a frequency-variable LC filter according to a comparative example, and FIG. 22B is a partially enlarged view of the characteristic graph illustrated in FIG. 22A. It should be noted that the frequency-variable LC filter 40K is used as the frequency-variable LC filter in the comparative example.

The frequency-variable LC filter 40M is configured by changing the circuit configuration in a path from the first connection terminal P401 to the first series arm LC filter circuit 41 in the frequency-variable LC filter 40K. To be specific, as illustrated in FIG. 21, a series circuit formed by fixed capacitors 426 and 425 is connected between the first connection terminal P401 and the first series arm LC filter circuit 41. The first parallel arm LC filter circuit 42M is different from the first parallel arm LC filter circuit 42 only in a connection point. The first parallel arm LC filter circuit 42M is connected between a path between the fixed capacitor 426 and the fixed capacitor 425 and the ground potential. With this configuration, the fixed capacitors 425 and 426 and the first parallel arm LC filter circuit 42M form a T-shaped high pass filter.

The frequency-variable LC filter 40M does not include the parallel arm LC filter circuit formed by the inductor 441 and the fixed capacitor 442, which are included in the frequency-variable LC filter 40K, between the first connection terminal P401 and the first series arm LC filter circuit 41. The frequency-variable LC filter 40M thus forms the T-shaped high pass filter without necessarily providing elements of the parallel arm LC filter circuit. With this, the frequency-variable LC filter 40M allows signals to pass in the pass band with lower loss than the frequency-variable LC filter 40K.

As indicated by a solid line and a dotted line in FIG. 22A, the frequency-variable LC filter 40M ensures the attenuation of equal to or higher than 35 dB in bands other than the pass band. As illustrated in the enlarged view in FIG. 22B, the frequency-variable LC filter 40M allows the signals to pass in the pass band with lower loss than the frequency-variable LC filter 40K. These effects of the frequency-variable LC filter 40M can also be provided even when the pass band is changed to the high frequency side as indicated by a dashed line and a long dashed double-dotted line in FIG. 22A and FIG. 22B.

Figure 23:
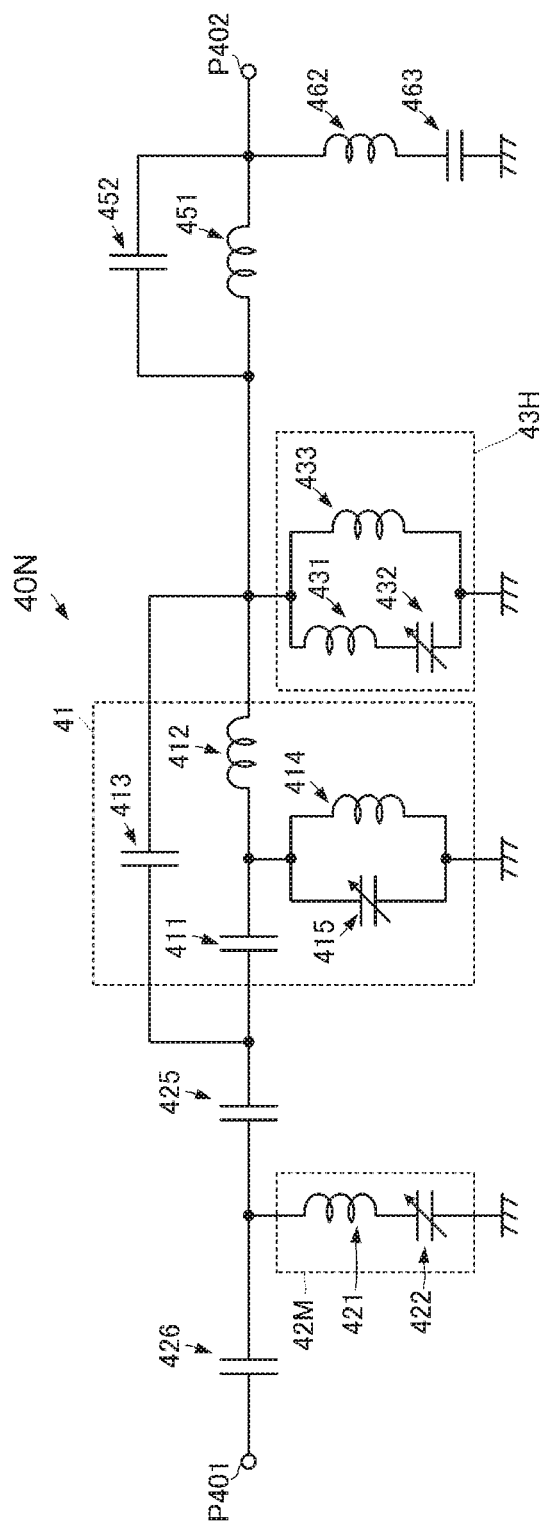
FIG. 23 is a circuit diagram of a frequency-variable LC filter according to a twelfth embodiment of the present disclosure.
Figure 24:
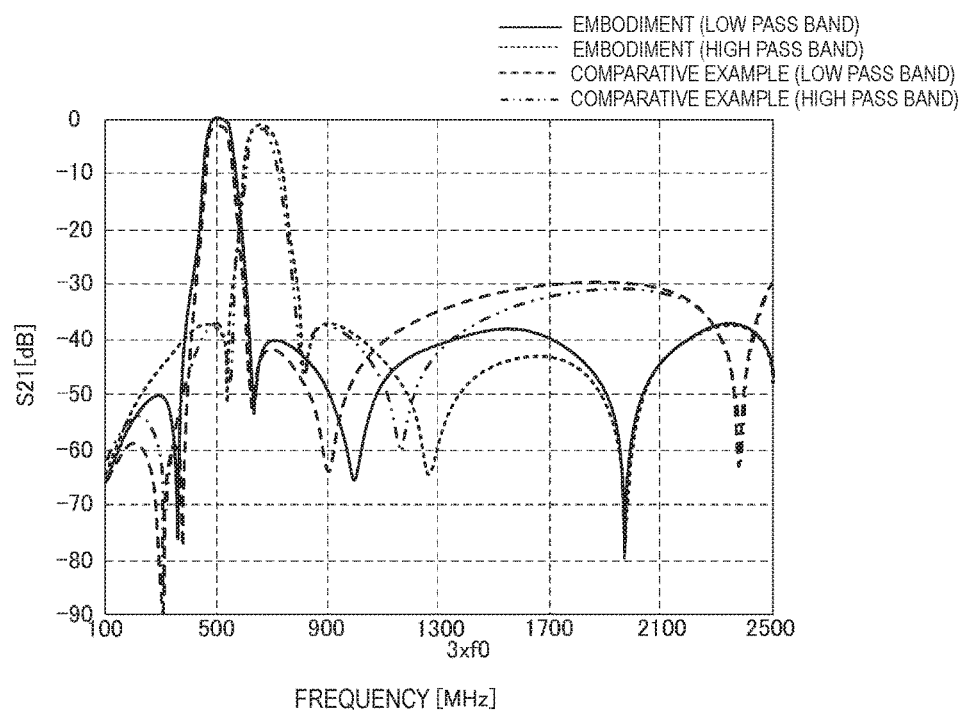
FIG. 24 is a graph illustrating bandpass characteristics of the frequency-variable LC filter in the twelfth embodiment of the present disclosure and bandpass characteristics of a frequency-variable LC filter according to a comparative example.

Next, FIG. 23 is a circuit diagram of a frequency-variable LC filter 40N according to a twelfth embodiment of the present disclosure. FIG. 24 is a graph illustrating bandpass characteristics of the frequency-variable LC filter 40N in the twelfth embodiment of the present disclosure and bandpass characteristics of a frequency-variable LC filter according to a comparative example. It should be noted that the frequency-variable LC filter 40K is used as the comparative example.

The frequency-variable LC filter 40N is configured by adding an inductor 462 and a fixed capacitor 463 to the frequency-variable LC filter 40M in order to increase the attenuation for the third harmonic of the signal in the pass band. A parallel arm LC filter circuit formed by the inductor 462 and the fixed capacitor 463 is connected between the second connection terminal P402 and the ground potential.

As indicated by a solid line and a dashed line in the characteristic graph in FIG. 24, the attenuation of the frequency-variable LC filter 40N is larger than the attenuation of the frequency-variable LC filter in the comparative example at a frequency of around 1350 MHz when the pass band is changed to the low frequency side. In the same manner, as indicated by a dotted line and a long dashed double-dotted line in FIG. 24, the attenuation of the frequency-variable LC filter 40N is larger than the attenuation of the frequency-variable LC filter in the comparative example at a frequency of around 1950 MHz when the pass band is changed to the high frequency side.

Figure 25:
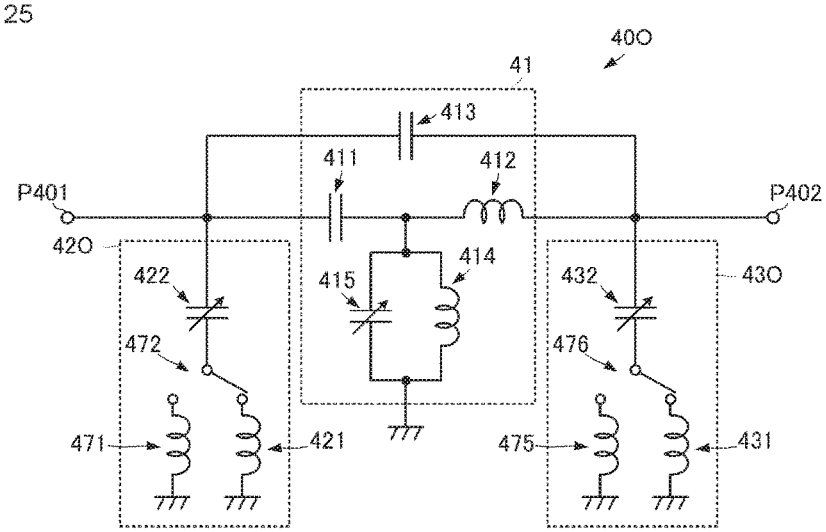
FIG. 25 is a circuit diagram of a frequency-variable LC filter according to a thirteenth embodiment of the present disclosure.

Next, FIG. 25 is a circuit diagram of a frequency-variable LC filter 40O according to a thirteenth embodiment of the present disclosure. The frequency-variable LC filter 40O in the embodiment is different from the frequency-variable LC filter 40 in a point that inductors in first and second parallel arm LC filter circuits 420 and 430 are switched by switches 472 and 476, respectively. The frequency-variable LC filter 40O is configured by increasing the change width of the pass band with the change of the capacitances of variable capacitors 422, 415, and 432 by switching the inductors in the first and second parallel arm LC filter circuits 420 and 430.

To be specific, as illustrated in FIG. 25, the first parallel arm LC filter circuit 420 includes the variable capacitor 422, the switch 472, an inductor 421, and an inductor 471. One end of the variable capacitor 422 is connected to the first connection terminal P401. The switch 472 includes one common terminal and two individual terminals. The common terminal of the switch 472 is connected to the other end of the variable capacitor 422. One individual terminal of the switch 472 is connected to one end of the inductor 421. The other individual terminal of the switch 472 is connected to one end of the inductor 471. The other ends of the inductors 421 and 471 are connected to the ground potential.

As illustrated in FIG. 25, the second parallel arm LC filter circuit 430 includes the variable capacitor 432, the switch 476, an inductor 431, and an inductor 475. One end of the variable capacitor 432 is connected to the second connection terminal P402. The switch 476 includes one common terminal and two individual terminals. The common terminal of the switch 476 is connected to the other end of the variable capacitor 432. One individual terminal of the switch 476 is connected to one end of the inductor 431. The other individual terminal of the switch 476 is connected to one end of the inductor 475. The other ends of the inductors 431 and 475 are connected to the ground potential.

When the common terminal and the individual terminal at the inductor 421 side are connected in the switch 472 and the common terminal and the individual terminal at the inductor 431 side are connected in the switch 476, the circuit configuration of the frequency-variable LC filter 400 is equivalent to the circuit configuration of the frequency-variable LC filter 40.

An inductance (L471) of the inductor 471 is set to be larger than an inductance (L421) of the inductor 421 (L471>L421). An inductance (L475) of the inductor 475 is set to be smaller than an inductance (L431) of the inductor 431 (L475<L431).

Figure 26:
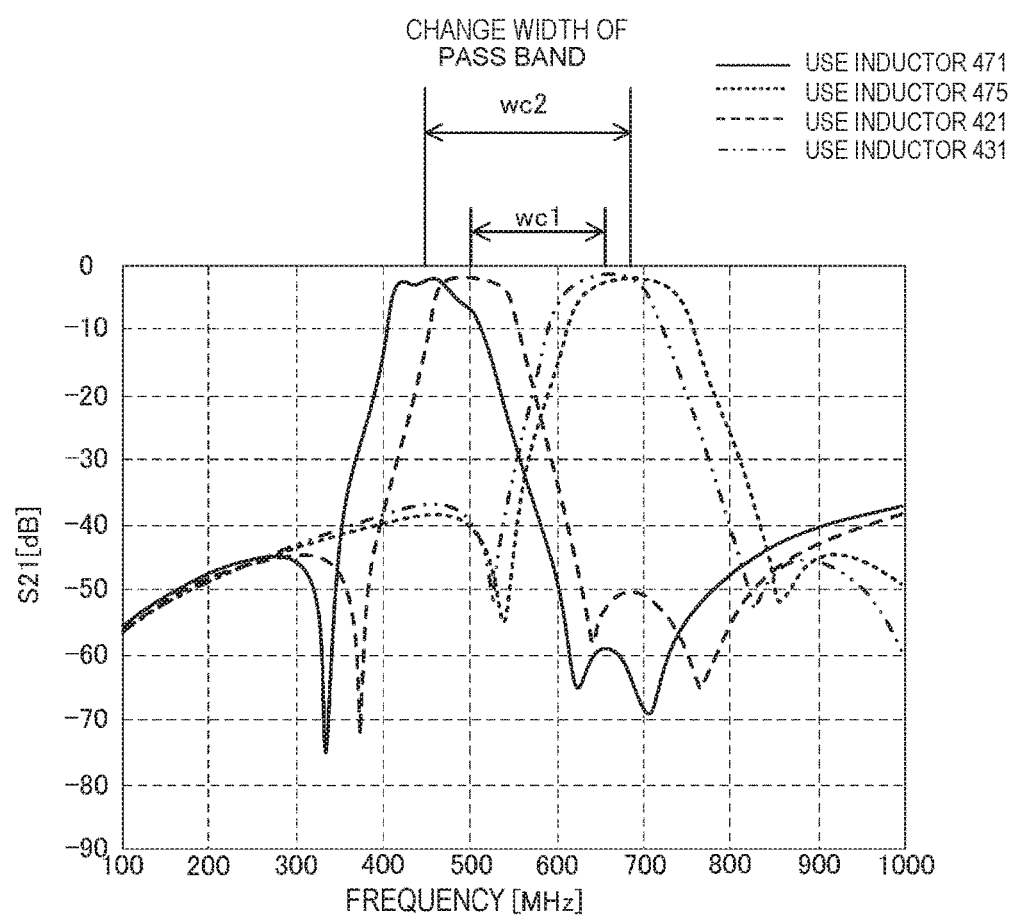
FIG. 26 is a graph illustrating bandpass characteristics of the frequency-variable LC filter in the thirteenth embodiment of the present disclosure.

FIG. 26 is a graph illustrating bandpass characteristics of the frequency-variable LC filter 400. A dashed line and a long dashed double-dotted line in FIG. 26 indicate the bandpass characteristics of the frequency-variable LC filter 40. That is to say, the dashed line and the long dashed double-dotted line in FIG. 26 indicate the bandpass characteristics when the inductors 421 and 431 are used. As illustrated in FIG. 26, a change width wc1 of the pass band of the frequency-variable LC filter 40 is approximately 160 MHz.

When connection of the switch 472 is switched and the inductor 471 having a large inductance is used, as indicated by a solid line in FIG. 26, the pass band is changed to the low frequency side in comparison with the case in which the inductor 421 having a small inductance is used (indicated by the dashed line in the drawing). When connection of the switch 476 is switched and the inductor 475 having a small inductance is used, as indicated by a dotted line in FIG. 26, the pass band is changed to the high frequency side in comparison with the case in which the inductor 421 having a large inductance is used (indicated by the long dashed double-dotted line in the drawing). As illustrated in FIG. 26, a change width wc2 of the pass band of the frequency-variable LC filter 400 is approximately 230 MHz and is larger than the change width wc1.

Furthermore, the frequency-variable LC filter 400 ensures the attenuation of equal to or larger than 35 dB in a frequency band of 100 MHz to 900 MHz. Furthermore, the frequency-variable LC filter 400 allows signals to pass in the pass band with low loss at substantially the same degree as the frequency-variable LC filter 40.

As described above, the frequency-variable LC filter 400 can increase the change width of the pass band while maintaining the bandpass characteristics and the attenuation characteristics.

A frequency-variable LC filter in the existing technique cannot provide desired bandpass characteristics and attenuation characteristics when the pass band is changed in some cases.

In order to provide the desired bandpass characteristics and attenuation characteristics even when the pass band is changed, the capacitances of the respective variable capacitors 422, 415, and 432 can be set as follows.

Figure 27:
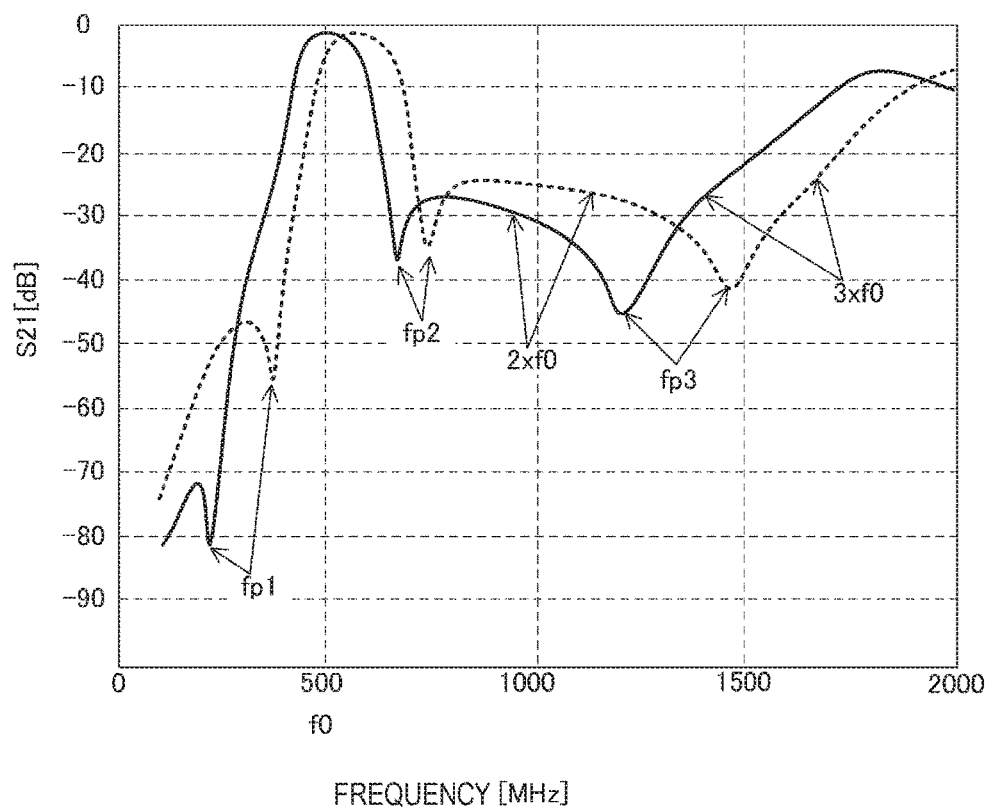
FIG. 27 is a graph illustrating bandpass characteristics of the frequency-variable LC filter in the first embodiment of the present disclosure for explaining a setting example of capacitances of respective variable capacitors of the frequency-variable LC filter.

FIG. 27 is a graph illustrating bandpass characteristics of the frequency-variable LC filter 40 in the first embodiment of the present disclosure for explaining a setting example of the capacitances of the respective variable capacitors 422, 415, and 432. Description is made below while the frequency of the attenuation pole at the low frequency side of the pass band having a center frequency f0 is a frequency fp1, the frequency of the attenuation pole at the high frequency side is a frequency fp2, and the frequency of the attenuation pole at the higher frequency side than the frequency fp2 is a frequency fp3 in FIG. 27. The attenuation pole at the frequency fp1 is formed by the first parallel arm LC filter circuit 42. The attenuation pole at the frequency fp2 is formed by the first series arm LC filter circuit 41. The attenuation pole at the frequency fp3 is formed by the second parallel arm LC filter circuit 43. Furthermore, the center frequency f0 is set by the first series arm LC filter circuit 41.

The inventor of the present application have found that desired bandpass characteristics and attenuation characteristics are provided by setting such that the frequencies fp1, fp2, and fp3 satisfy the following three inequalities with reference to the center frequency f0.

$$f0/2 < fp1 < f0 \qquad \text{Equation 1:}$$

$$f0 < fp2 < 3 \times f0/2 \qquad \text{Equation 2:}$$

$$2 \times f0 < fp3 < 3 \times f0 \qquad \text{Equation 3:}$$

The capacitances of the variable capacitors 422, 415, and 432 are set so as to satisfy these three inequalities. Then, as illustrated in FIG. 27, signals in the pass band can be made to pass therethrough with low loss even when the pass band is changed. In addition, the attenuations of equal to or larger than approximately 30 dB can be ensured at around the frequencies fp1 and fp2 of the attenuation poles at both sides of the pass band even when the pass band is changed. Furthermore, the attenuations of equal to or larger than approximately 25 dB can be ensured for the second and third harmonics of the signal in the pass band.

Figure 28A:
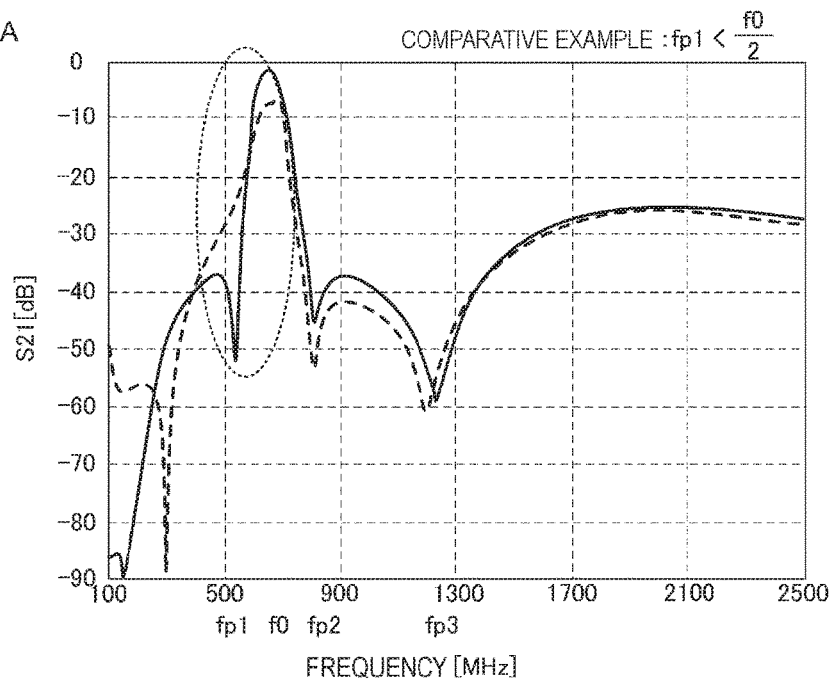
FIG. 28A is a graph illustrating bandpass characteristics of the frequency-variable LC filter when the capacitances of the respective variable capacitors are changed and FIG. 28B is an enlarged view of a range indicated by a dotted line in the characteristic graph in FIG. 28A.
Figure 28B:
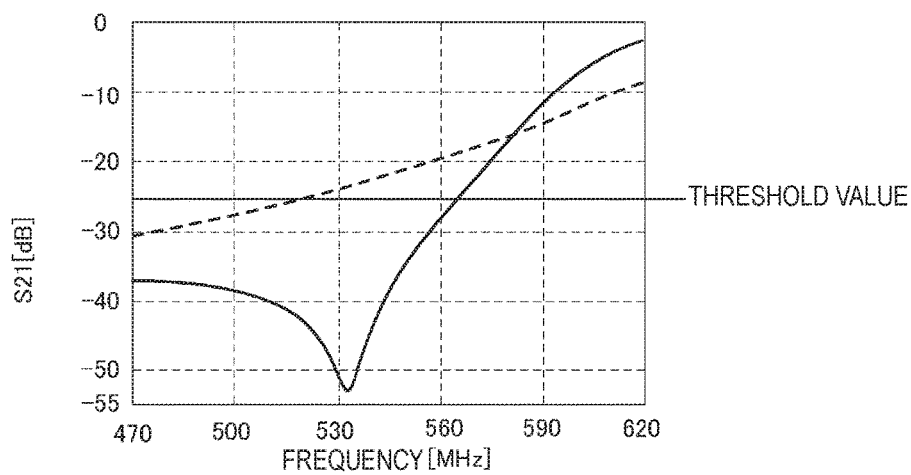

FIG. 28A is a graph illustrating bandpass characteristics of the frequency-variable LC filter 40 when the capacitances of the respective variable capacitors 422, 415, and 432 are changed and FIG. 28B is an enlarged view of a range indicated by a dotted line in the characteristic graph in FIG. 28A.

Solid lines in FIGS. 28A and 28B indicate the bandpass characteristics of the frequency-variable LC filter 40 satisfying all of the above-described equations 1 to 3. Dashed lines indicate the bandpass characteristics of a frequency-variable LC filter when the above-described equations 2 and 3 are satisfied and the frequency fp1 in the above-described equation 1 is set to be lower than 1/2-fold of the center frequency f0.

As illustrated in FIGS. 28A and 28B, the frequency-variable LC filter in the comparative example, which does not satisfy the above-described equation 1, increases a signal loss amount in the pass band. Furthermore, the frequency-variable LC filter in the comparative example, which does not satisfy the above-described equation 1, decreases the attenuation in a frequency band of 470 MHz to 580 MHz at the low frequency side of the pass band. When a threshold value of the attenuation is assumed to be 25 dB, the frequency-variable LC filter in the comparative example allows signals to pass in an unnecessary band of 520 MHz to 570 MHz. Accordingly, when the frequency-variable LC filter in the comparative example, which does not satisfy the above-described equation 1, is used for wireless communication of the TV white space, an S/N (signal to noise) ratio is deteriorated and it allows unnecessary signals to pass for 8 channels. On the other hand, the frequency-variable LC filter 40 which satisfies all of the above-described equations 1 to 3 does not allow the signals to pass in the unnecessary band of 520 MHz to 570 MHz.

Figure 29A:
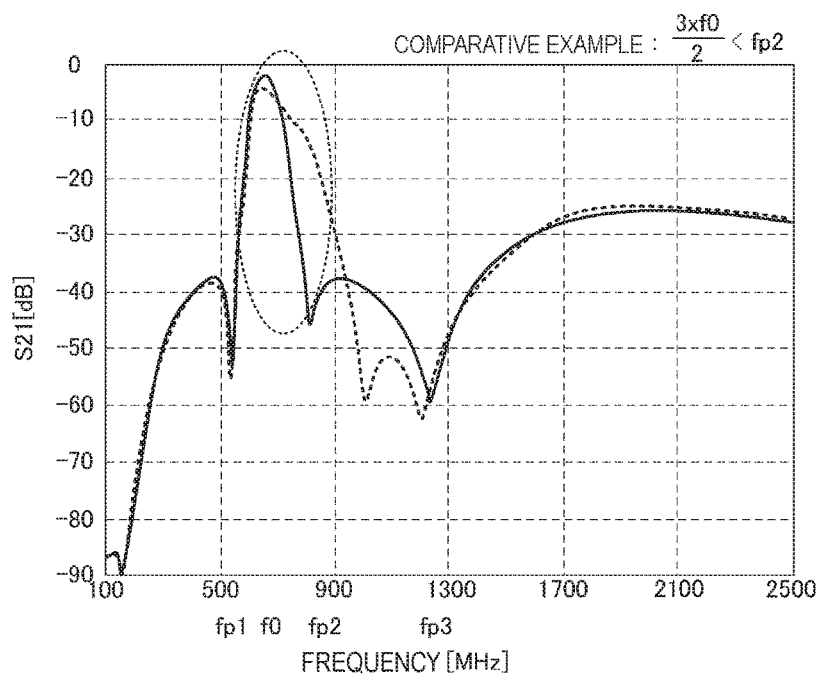
FIG. 29A is a graph illustrating bandpass characteristics of the frequency-variable LC filter when the capacitances of the respective variable capacitors are changed and FIG. 29B is an enlarged view of a range indicated by a dotted line in the characteristic graph in FIG. 29A.
Figure 29B:
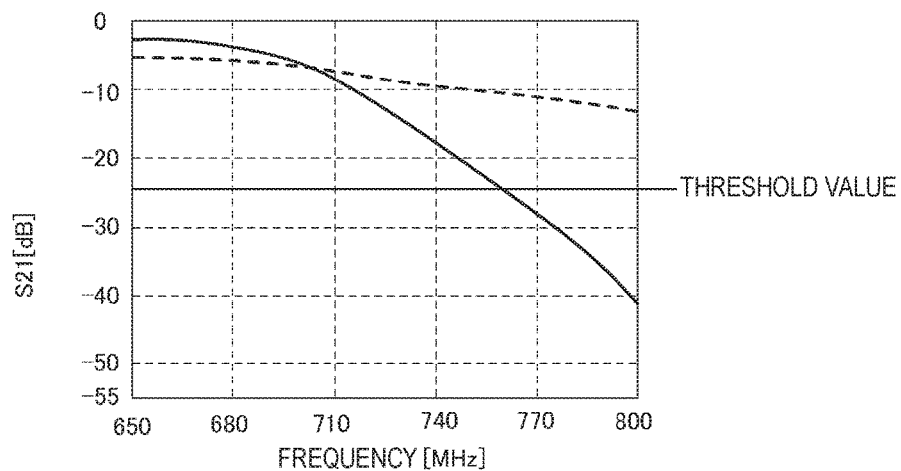

Next, FIG. 29A is a graph illustrating bandpass characteristics of the frequency-variable LC filter 40 when the capacitances of the respective variable capacitors 422, 415, and 432 are changed and FIG. 29B is an enlarged view of a range indicated by a dotted line in the characteristic graph in FIG. 29A.

Solid lines in FIGS. 29A and 29B indicate the bandpass characteristics of the frequency-variable LC filter 40 satisfying all of the above-described equations 1 to 3. Dashed lines indicate the bandpass characteristics of a frequency-variable LC filter when the above-described equations 1 and 3 are satisfied and the frequency fp2 in the above-described equation 2 is set to be higher than 3/2-fold of the center frequency f0.

As illustrated in FIGS. 29A and 29B, the frequency-variable LC filter in the comparative example, which does not satisfy the above-described equation 2, increases the signal loss amount in the pass band. Furthermore, the frequency-variable LC filter in the comparative example, which does not satisfy the above-described equation 2, decreases the attenuation in a frequency band of 700 MHz to 800 MHz at the high frequency side of the pass band. When the threshold value of the attenuation is assumed to be 25 dB, the frequency-variable LC filter in the comparative example allows signals to pass in an unnecessary band of 760 MHz to 800 MHz. Accordingly, when the frequency-variable LC filter in the comparative example, which does not satisfy the above-described equation 2, is used for the wireless communication of the TV white space, the S/N ratio is deteriorated and it allows unnecessary signals to pass for 6 channels. On the other hand, the frequency-variable LC filter 40 which satisfies all of the above-described equations 1 to 3 does not allow the signals to pass in the unnecessary band of 760 MHz to 800 MHz.

Figure 30:
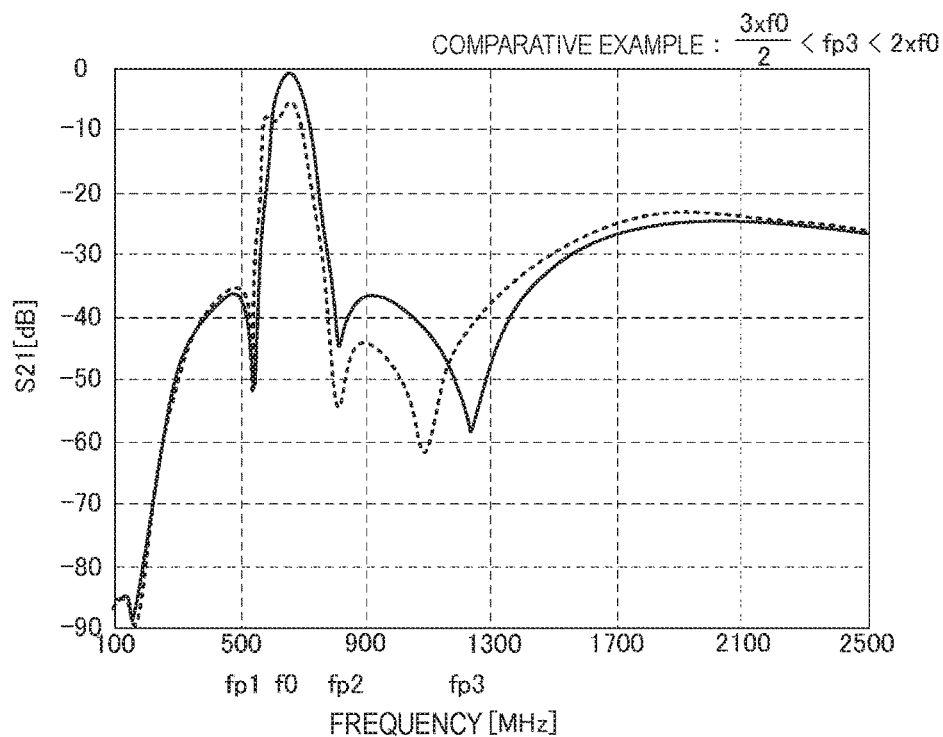
FIG. 30 is a graph illustrating bandpass characteristics of the frequency-variable LC filter when the capacitances of the respective variable capacitors are changed.

FIG. 30 is a graph illustrating bandpass characteristics of the frequency-variable LC filter 40 when the capacitances of the respective variable capacitors 422, 415, and 432 are changed.

A solid line in FIG. 30 indicates the bandpass characteristics of the frequency-variable LC filter 40 satisfying all of the above-described equations 1 to 3. A dashed line indicates the bandpass characteristics of a frequency-variable LC filter when the above-described equations 1 and 2 are satisfied and the frequency fp3 in the above-described equation 3 is set to be higher than 3/2-fold of the center frequency f0 and be lower than 2-fold of the center frequency f0.

As illustrated in FIG. 30, the frequency-variable LC filter in the comparative example, which does not satisfy the above-described equation 3, increases the signal loss amount in the pass band. Accordingly, when the frequency-variable LC filter in the comparative example, which does not satisfy the above-described equation 3, is used for the wireless communication of the TV white space, the S/N ratio is deteriorated.

Figure 31:
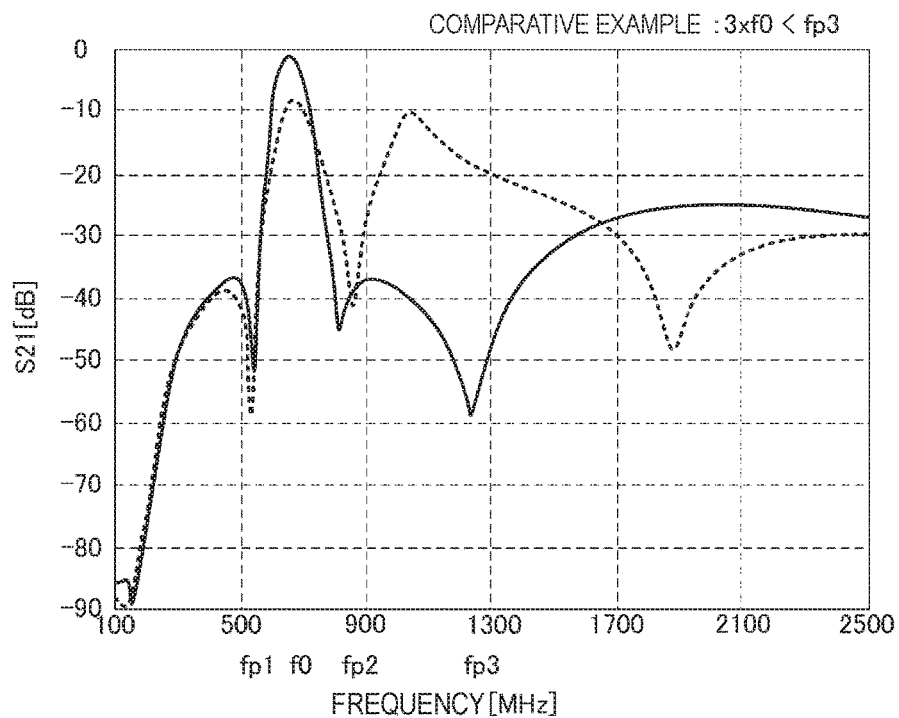
FIG. 31 is a graph illustrating bandpass characteristics of the frequency-variable LC filter when the capacitances of the respective variable capacitors are changed.

Next, FIG. 31 is a graph illustrating bandpass characteristics of the frequency-variable LC filter 40 when the capacitances of the respective variable capacitors 422, 415, and 432 are changed.

A solid line in FIG. 31 indicates the bandpass characteristics of the frequency-variable LC filter 40 satisfying all of the above-described equations 1 to 3. A dashed line indicates the bandpass characteristics of a frequency-variable LC filter when the above-described equations 1 and 2 are satisfied and the frequency fp3 in the above-described equation 3 is set to be higher than 3-fold of the center frequency f0.

As illustrated in FIG. 31, the frequency-variable LC filter in the comparative example, which does not satisfy the above-described equation 3, increases the signal loss amount in the pass band. Furthermore, the frequency-variable LC filter in the comparative example, which does not satisfy the above-described equation 3, extremely decreases the attenuation to be 10 dB at a frequency of around 1100 MHz. Accordingly, when the frequency-variable LC filter in the comparative example, which does not satisfy the above-described equation 3, is used for the wireless communication of the TV white space, the S/N ratio is deteriorated.

As described above, by setting the capacitances of the respective variable capacitors 422, 415, and 432 so as to satisfy the above-described equations 1 to 3, the bandpass characteristics and the attenuation characteristics of the frequency-variable LC filter 40 are maintained even when the pass band is changed.

REFERENCE SIGNS LIST

10 HIGH-FREQUENCY FRONT END CIRCUIT
20 ANTENNA MATCHING CIRCUIT
30 FREQUENCY-FIXED FILTER
40, 40A, 40B, 40C, 40D, 40E, 40F, 40G, 40H, 401, 40J, 40K, 40L, 40M, 40N, 400 FREQUENCY-VARIABLE LC FILTER
41, 41J FIRST SERIES ARM LC FILTER CIRCUIT
42, 42M, 420 FIRST PARALLEL ARM LC FILTER CIRCUIT
43, 43H, 430 SECOND PARALLEL ARM LC FILTER CIRCUIT
50 DIPLEXER
61, 62 FREQUENCY-VARIABLE FILTER
71 TRANSMISSION-SIDE AMPLIFICATION CIRCUIT
72 RECEPTION-SIDE AMPLIFICATION CIRCUIT
80 SIGNAL PROCESSOR
91 TRANSMISSION CIRCUIT
92 RECEPTION CIRCUIT
411, 413 CAPACITOR
423, 424, 425, 426, 442, 443, 452, 463 FIXED CAPACITOR
412, 414, 416, 417, 421, 431, 433, 441, 451, 462, 471, 475 INDUCTOR
415, 422, 432 VARIABLE CAPACITOR
418, 472, 476 SWITCH
601 SERIES ARM RESONANCE CIRCUIT
602 FIRST PARALLEL ARM RESONANCE CIRCUIT
603 SECOND PARALLEL ARM RESONANCE CIRCUIT
610 CAPACITOR
611, 621, 631 ELASTIC WAVE RESONATOR
612, 622, 632 INDUCTOR
613, 623, 633 VARIABLE CAPACITOR
801 TRANSMISSION SIGNAL GENERATOR
802 DEMODULATOR
810 CHANNEL DETERMINATION UNIT
ANT ANTENNA
P401 FIRST CONNECTION TERMINAL
P402 SECOND CONNECTION TERMINAL
P601, P602 CONNECTION TERMINAL

The invention claimed is:
1. A frequency-variable LC filter comprising:
an input terminal;
an output terminal;
a first series arm LC filter circuit connected between the input terminal and the output terminal, wherein a first end of the first series arm LC filter circuit is connected to the input terminal and a second end of the first series arm LC filter circuit is connected to the output terminal;

a first parallel arm LC filter circuit connected between the first end of the first LC series arm filter circuit and ground; and a second parallel arm LC filter circuit connected between the second end of the first LC series arm filter circuit and ground, wherein:

each of the first parallel arm LC filter circuit and the second parallel arm LC filter circuit comprises a parallel arm variable capacitor and a parallel arm inductor connected in series, the first series arm LC filter circuit comprises a series arm LC filter circuit fixed capacitor, an LC series circuit, and an LC parallel circuit, wherein:

the series arm LC filter circuit fixed capacitor is connected in parallel with the LC series circuit, the LC series circuit comprises an LC series circuit fixed capacitor and an LC series circuit inductor connected in series, the LC series circuit fixed capacitor being connected to the input terminal and the LC series circuit inductor being directly connected to the output terminal or being connected to the output terminal with another inductor interposed between the LC series circuit inductor and the output terminal, and the LC parallel circuit comprises an LC parallel circuit variable capacitor and an LC parallel circuit inductor connected in parallel.

2. The frequency-variable LC filter according to claim 1, wherein:

a resonant frequency of the first parallel arm LC filter circuit is less than a center frequency of a pass band of the frequency-variable LC filter, and a resonant frequency of the second parallel arm LC filter circuit is greater than the center frequency.

3. The frequency-variable LC filter according to claim 2, wherein:

a resonant frequency of the LC parallel circuit of the first series arm LC filter circuit is greater than the resonant frequency of the first parallel arm LC filter circuit and is less than the center frequency, and a resonant frequency of the LC series circuit of the first series arm LC filter circuit is greater than the center frequency and are less than the resonant frequency of the second parallel arm LC filter circuit.

4. The frequency-variable LC filter according to claim 1, wherein the LC series circuit inductor of the LC series circuit, the LC parallel circuit inductor of the LC parallel circuit, and the parallel arm inductor of the first parallel arm LC filter circuit each have an inductance greater than 20 nH, and the parallel arm variable capacitor of the first parallel arm LC filter circuit and the parallel arm variable capacitor of the second parallel arm LC filter circuit each have a capacitance less than 20 pF.

5. The frequency-variable LC filter according to claim 4, wherein a capacitance of the parallel arm variable capacitor of the first series arm LC filter circuit is less than 20 pF.

6. The frequency-variable LC filter according to claim 1, wherein at least two of the parallel arm inductor of the first parallel arm LC filter circuit, the LC series circuit inductor of the LC series circuit, the LC parallel circuit inductor of the LC parallel circuit, and the parallel arm inductor of the second parallel arm LC filter circuit are magnetically coupled with each other.

7. The frequency-variable LC filter according to claim 1, wherein the parallel arm inductor of the first parallel arm LC filter circuit is capacitively coupled with at least one of the LC series circuit inductor of the LC series circuit, the LC parallel circuit inductor of the LC parallel circuit, and the parallel arm inductor of the second parallel arm LC filter circuit.

8. The frequency-variable LC filter according to claim 1, further comprising:

a first fixed capacitor connected between the first end of the first series arm LC filter circuit and the input terminal;

a second LC series circuit connected at one end to a node between the first fixed capacitor and the input terminal and at another end to ground; and a second fixed capacitor connected between the output terminal and ground, wherein the second parallel arm LC filter circuit further comprises a second inductor connected in parallel with the parallel arm variable capacitor and the parallel arm inductor that are connected in series.

9. The frequency-variable LC filter according to claim 1, further comprising:

a first fixed capacitor connected between the first end of the first series arm LC filter circuit and the first parallel arm LC filter circuit;

a second fixed capacitor connected between the input terminal and the first parallel arm LC filter circuit, the second fixed capacitor being connected in series with the first fixed capacitor; and a series arm LC circuit connected between the second end of the first series arm LC filter circuit and the output terminal, and comprising an inductor and a fixed capacitor connected in parallel, wherein the second parallel arm LC filter circuit further comprises a second inductor connected in parallel to the parallel arm variable capacitor and the parallel arm inductor that are connected in series.

10. The frequency-variable LC filter according to claim 9, further comprising a second LC series circuit connected at one end to a node between the series arm LC circuit and the output terminal and at another end to ground, wherein the second LC series circuit comprises a second LC series circuit inductor and a second LC series circuit capacitor connected in series.

11. The frequency-variable LC filter according to claim 1, wherein:

a center frequency f0 of a pass band is defined by the first series arm LC filter circuit;

a frequency fp2 of an second attenuation pole is defined by the first series arm LC filter circuit and is greater than the pass band;

a frequency fp1 of a first attenuation pole is defined by the first parallel arm LC filter circuit and is less than the pass band;

a frequency fp3 of a third attenuation pole is defined by the second parallel arm LC filter circuit and is greater than the frequency fp2; and the center frequency f0, the frequency fp1 of the first attenuation pole, the frequency fp2 of the second attenuation pole, and the frequency fp3 of the third attenuation pole satisfy the following equations:

$f0/2 \leq fp1 < f0$ $f0 \leq fp2 < 3 \times f0/2$ $2 \times f0 \leq fp3 < 3 \times f0.$ 12. A high-frequency front end circuit for wireless communication in a usage channel selected from vacant channels, the usage channel and the vacant channels being among a plurality of communication channels in a frequency band used in a wireless communication system, the circuit comprising:
  a fixed filter configured to attenuate a high-frequency signal outside the frequency band;
  a first variable filter configured to attenuate a high-frequency signal in the frequency band but of a communication channel other than the usage channel, the communication channel other than the usage channel varying in accordance with a selection of the usage channel; and
  a second variable filter formed by a frequency-variable-type LC filter and configured to attenuate an intermodulation distortion in the frequency band,
  wherein the second variable filter is the frequency-variable LC filter according to claim 1.

13. The high-frequency front end circuit according to claim 12, wherein the first variable filter comprises:
  an input terminal;
  an output terminal;
  a series arm resonance circuit connected between the input terminal and the output terminal, a first end of the series arm resonance circuit being connected to the input terminal and a second end of the series arm resonance circuit being connected to the output terminal;
  a first parallel arm resonance circuit connected between the first end of the series arm resonance circuit and ground; and
  a second parallel arm resonance circuit connected between the second end of the series arm resonance circuit and ground, wherein:
  the series arm resonance circuit comprises a fixed capacitor having a fixed capacitance, and a variable capacitor, an inductor, and an elastic wave resonator connected in parallel with each other and in series with the fixed capacitor,
  each of the first parallel arm resonance circuit and the second parallel arm resonance circuit comprises a variable capacitor, an inductor, and an elastic wave resonator connected in series with each other, and
  the fixed capacitor is connected to the end of the series arm resonance circuit to which the parallel arm resonance circuit having the elastic wave resonator with the lowest impedance is connected.

14. The high-frequency front end circuit according to claim 12, further including:
  a detector circuit configured to detect reception levels of the vacant channels; and
  a determination unit configured to select, as the usage channel, a vacant channel having the highest reception level among the detected reception levels.

15. The high-frequency front end circuit according to claim 12, further comprising an amplification circuit.

16. The high-frequency front end circuit according to claim 12, further comprising a signal processor.

17. The frequency-variable LC filter according to claim 1, wherein:
  the first parallel arm LC filter circuit further comprises a fixed capacitor connected in parallel with the parallel arm variable capacitor and the parallel arm inductor that are connected in series, or
  the second parallel arm LC filter circuit further comprises a second inductor connected in parallel with the parallel arm variable capacitor and the parallel arm inductor that are connected in series.

18. The frequency-variable LC filter according to claim 1, wherein the LC parallel circuit further comprises a second LC parallel circuit inductor connected in series with the LC parallel circuit variable capacitor and in parallel with the LC parallel circuit inductor of the LC parallel circuit.

* * * * *

UNITED STATES PATENT AND TRADEMARK OFFICE
CERTIFICATE OF CORRECTION

PATENT NO. : 10,284,163 B2
APPLICATION NO. : 15/914493
DATED : May 7, 2019
INVENTOR(S) : Hirotsugu Mori Page 1 of 1

It is certified that error appears in the above-identified patent and that said Letters Patent is hereby corrected as shown below:

In the Specification

Column 17, Line 60, "LC filter 401" should read -- LC filter 40I --

Column 18, Line 26, "LC filter 401" should read -- LC filter 40I --

Column 26, Line 22, "40F, 40G, 40H, 401" should read -- 40F, 40G, 40H, 40I --

Signed and Sealed this
Twenty-ninth Day of September, 2020

Andrei Iancu
*Director of the United States Patent and Trademark Office*